United States Patent
Oh et al.

(10) Patent No.: US 11,157,359 B2
(45) Date of Patent: Oct. 26, 2021

(54) TECHNIQUES TO IMPLEMENT A HYBRID ERROR CORRECTION CODE SCHEME

(71) Applicant: Intel Corporation, Santa Clara, CA (US)

(72) Inventors: Byoungchan Oh, Hillsboro, OR (US); Wei Wu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/031,772

(22) Filed: Sep. 24, 2020

(65) Prior Publication Data

US 2021/0019225 A1 Jan. 21, 2021

(51) Int. Cl.
*G06F 11/00* (2006.01)
*G06F 11/10* (2006.01)
*H03M 13/29* (2006.01)
*H03M 13/15* (2006.01)

(52) U.S. Cl.
CPC ....... *G06F 11/1068* (2013.01); *H03M 13/152* (2013.01); *H03M 13/2906* (2013.01)

(58) Field of Classification Search
None
See application file for complete search history.

(56) References Cited

U.S. PATENT DOCUMENTS

| | | | |
|---|---|---|---|
| 2016/0042809 A1* | 2/2016 | Kim | G11C 29/42 714/719 |
| 2018/0210787 A1* | 7/2018 | Bains | G06F 11/1068 |
| 2019/0042358 A1* | 2/2019 | Criss | G06F 3/064 |
| 2019/0130991 A1* | 5/2019 | Son | G06F 11/1064 |
| 2020/0135292 A1* | 4/2020 | Kim | G06F 11/106 |
| 2020/0278908 A1* | 9/2020 | Schaefer | G11C 7/1018 |
| 2021/0083687 A1* | 3/2021 | Lee | H03M 13/1105 |
| 2021/0133028 A1* | 5/2021 | Kim | G06F 11/1076 |

OTHER PUBLICATIONS

V. Gherman, S. Evain and Y. Bonhomme, "Memory reliability improvements based on maximized error-correcting codes," 2012 17th IEEE European Test Symposium (ETS), 2012, pp. 1-6, doi: 10.1109/ETS.2012.6233018. (Year: 2012).*

* cited by examiner

*Primary Examiner* — Daniel F. McMahon
(74) *Attorney, Agent, or Firm* — Compass IP Law PC

(57) ABSTRACT

Examples include techniques to improve implement an error correction codeword (ECC) scheme to protect data stored to a memory from both hard and random bit errors using a hybrid ECC scheme that includes generation of first and second codewords to protect the data.

27 Claims, 19 Drawing Sheets

Apparatus 1400

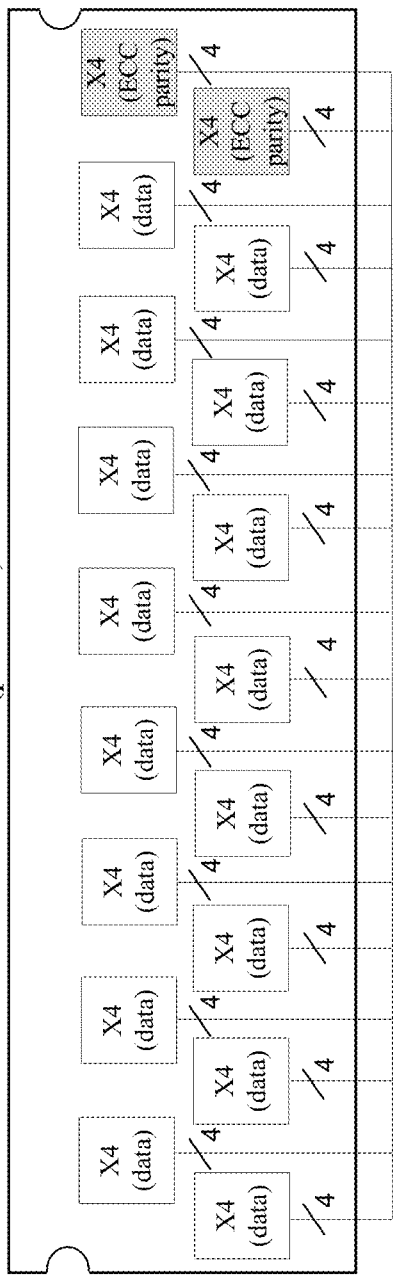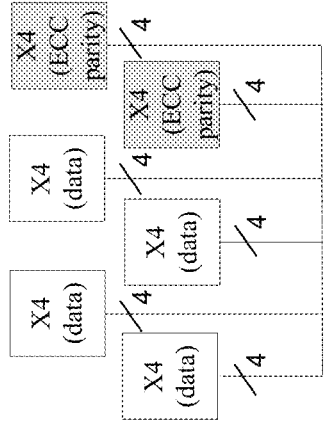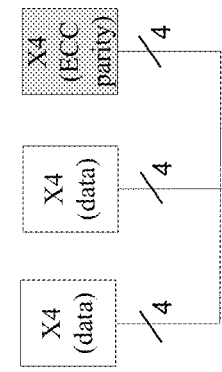
FIG. 2

Parity Scheme 700

*FIG. 7*

$S0 = D0 \oplus D16 \oplus D32 \oplus D48 \oplus E0 \oplus P0$
$S1 = D1 \oplus D17 \oplus D33 \oplus D49 \oplus E1 \oplus P1$
$\vdots$
$S8 = D8 \oplus D24 \oplus D40 \oplus D56 \oplus E8 \oplus P8$ Parity Syndrome 710

$P0 = D0 \oplus D16 \oplus D32 \oplus D48 \oplus E0$
$P1 = D1 \oplus D17 \oplus D33 \oplus D49 \oplus E1$
$\vdots$
$P8 = D8 \oplus D24 \oplus D40 \oplus D56 \oplus E8$ Parity 705

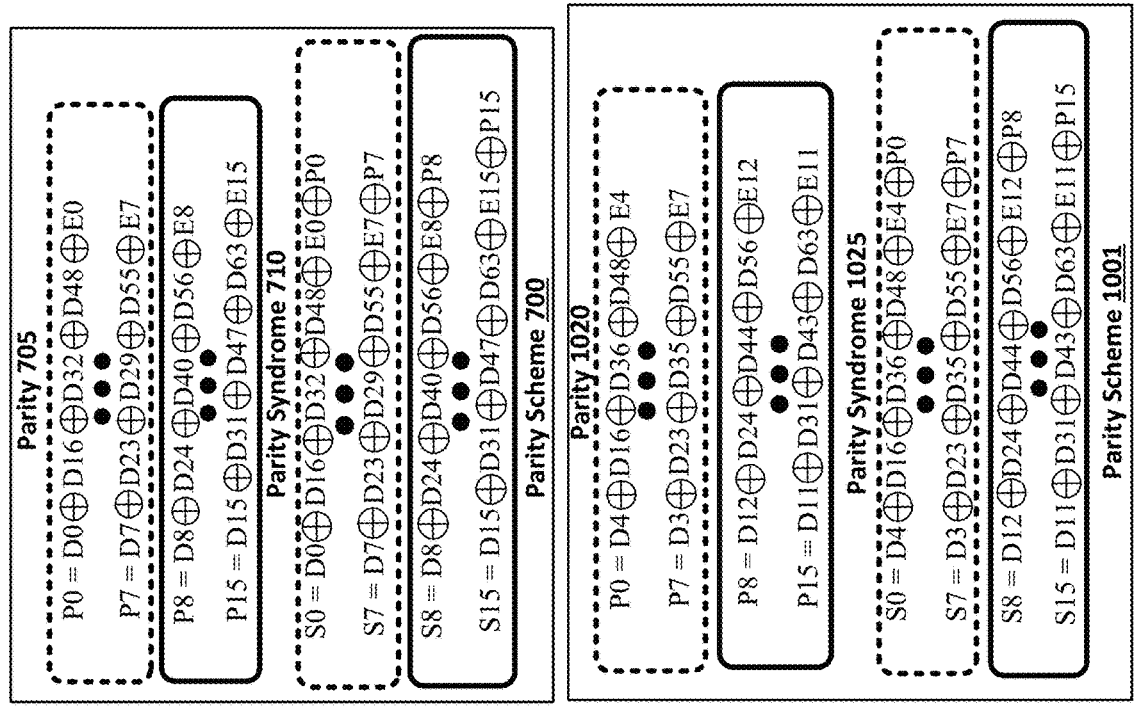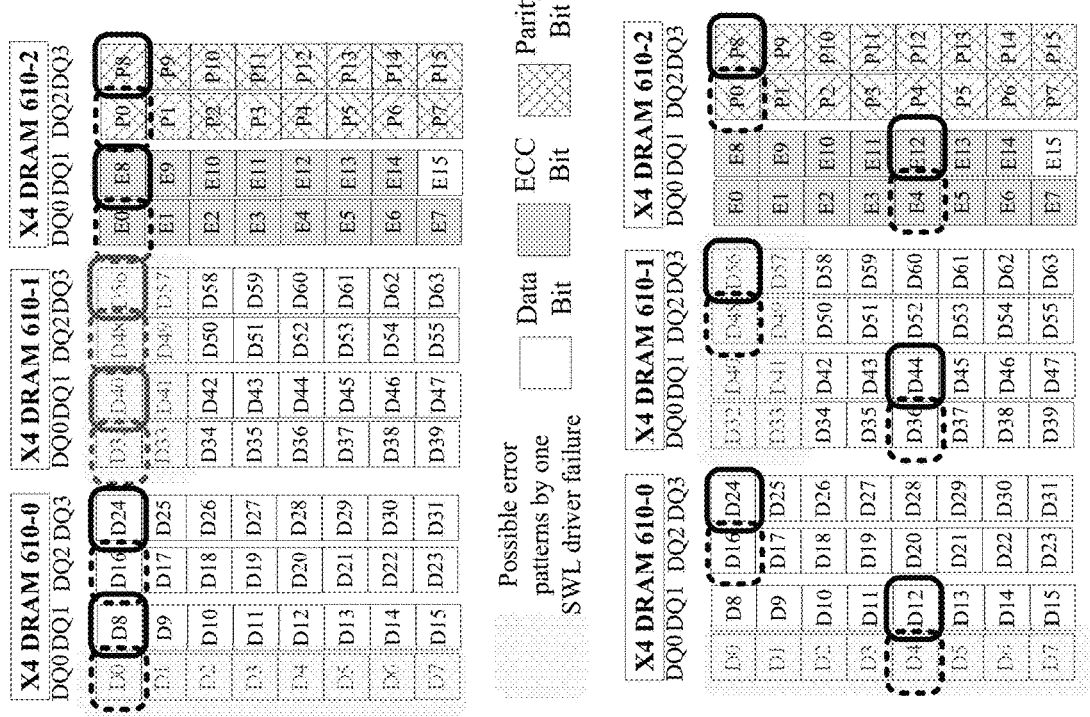
FIG. 10

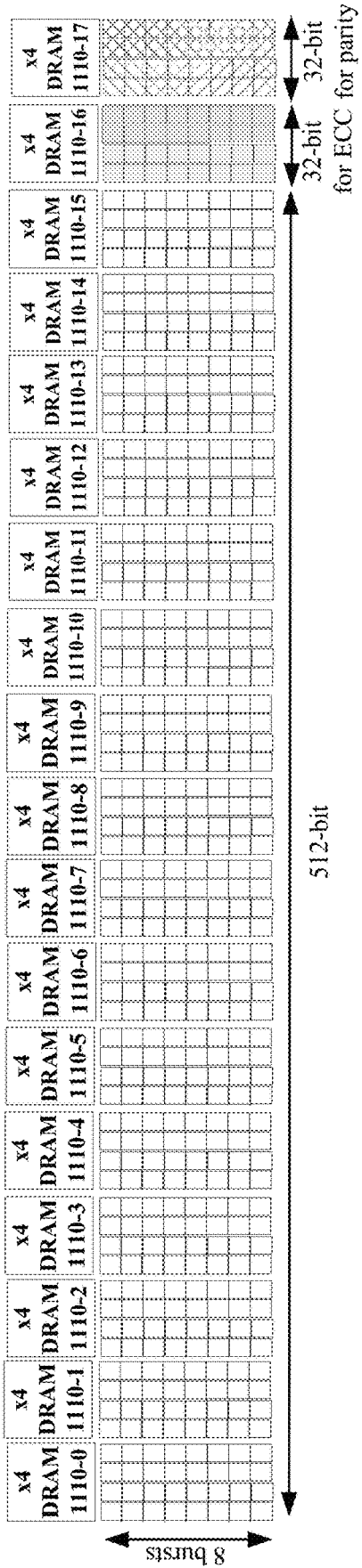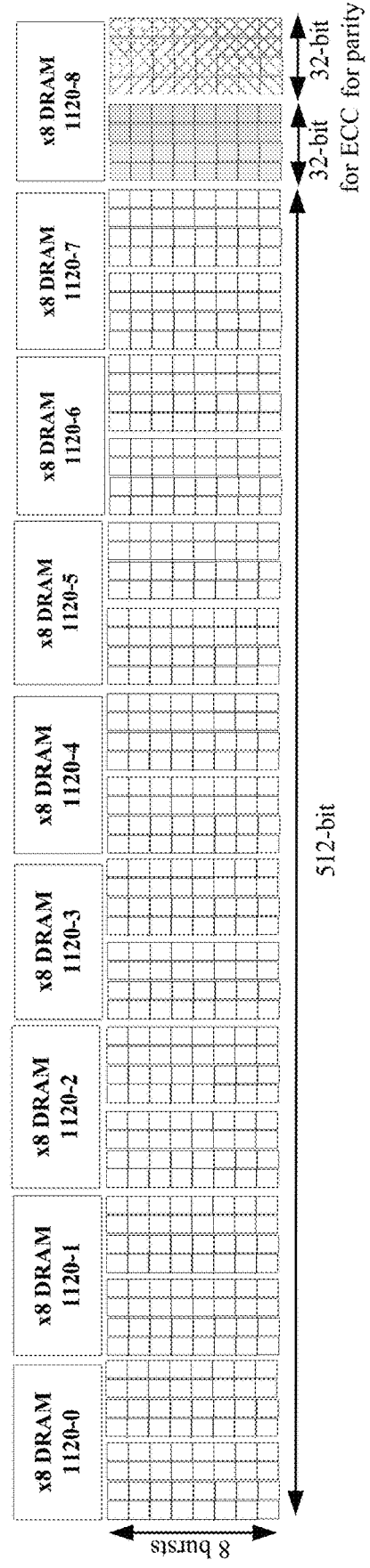
FIG. 11

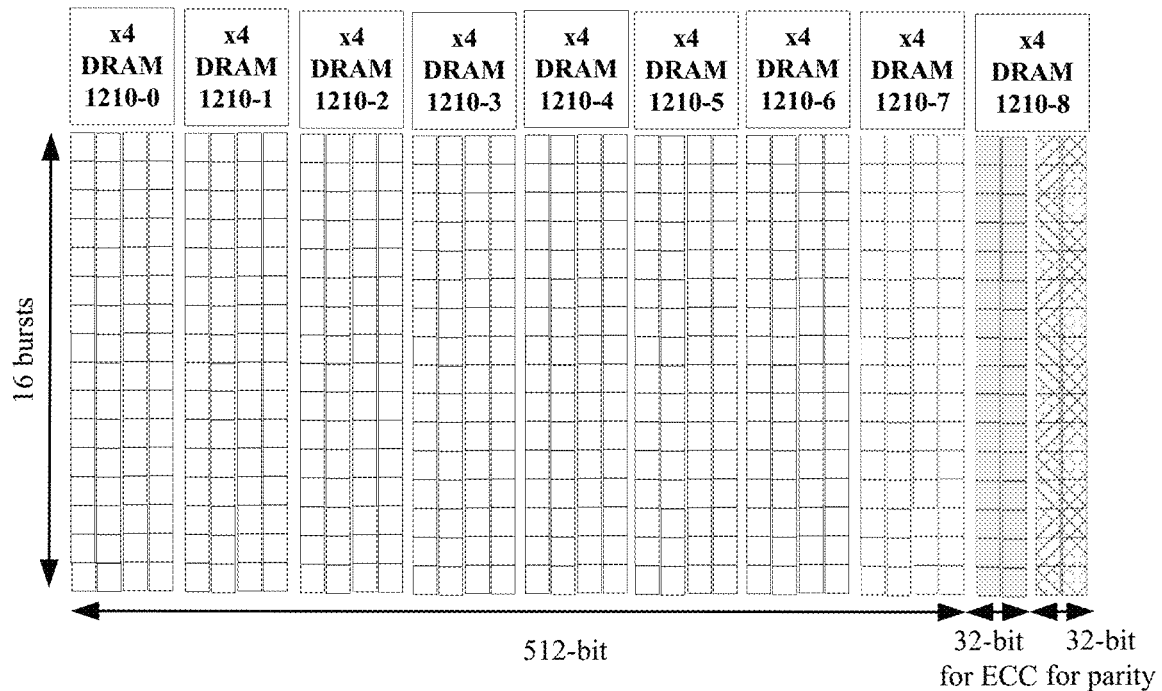
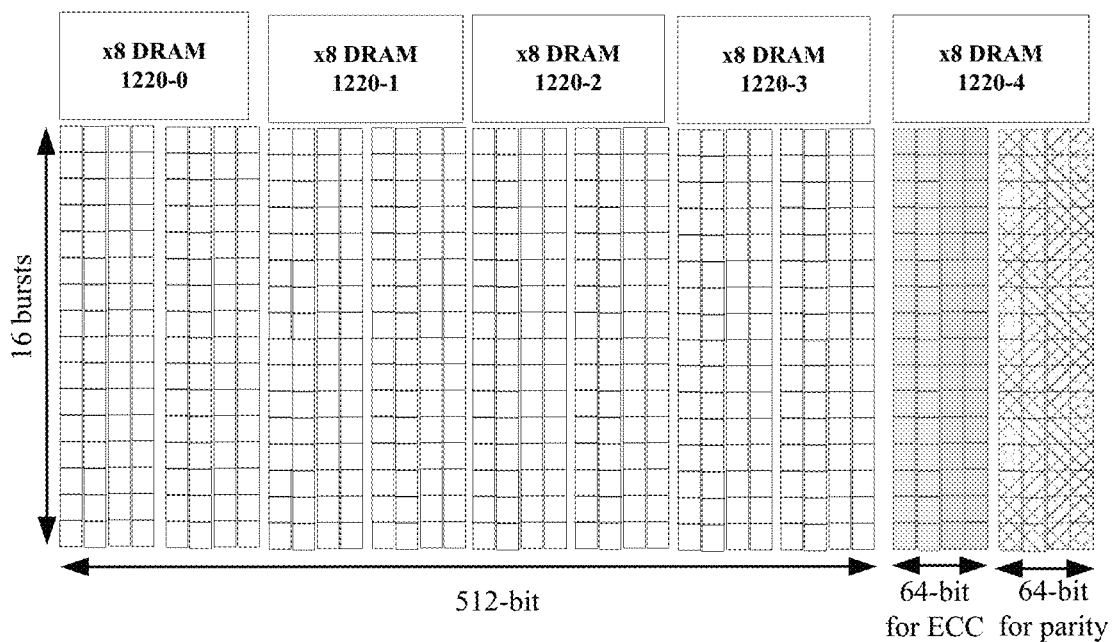
FIG. 12

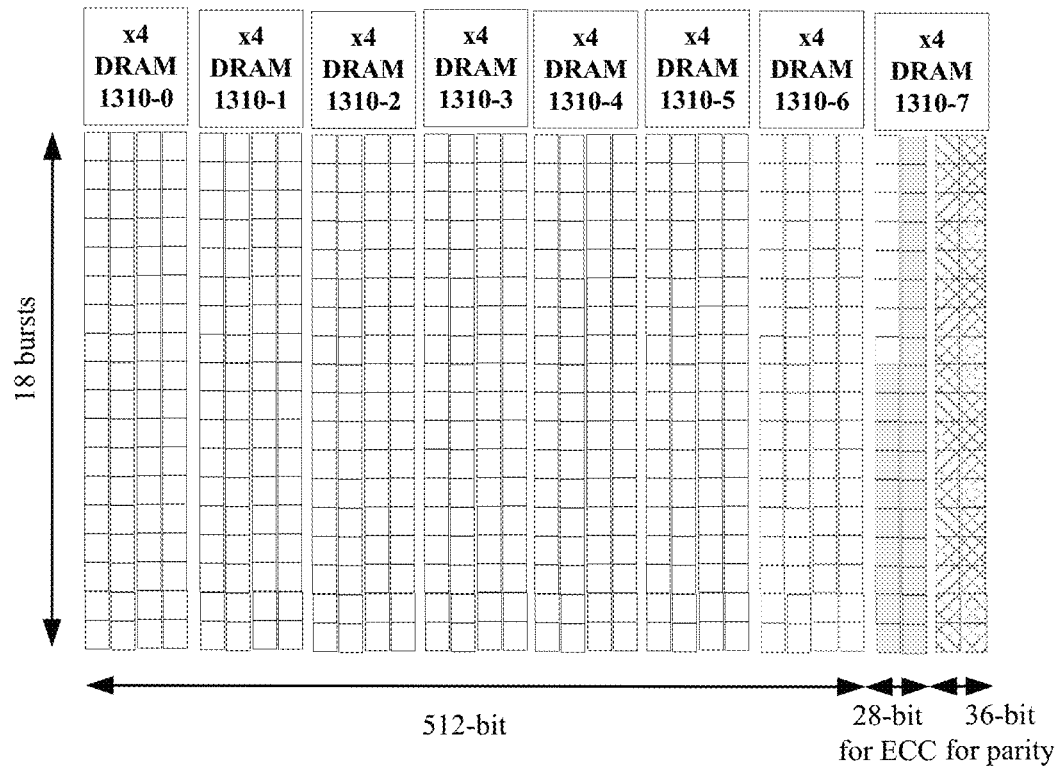
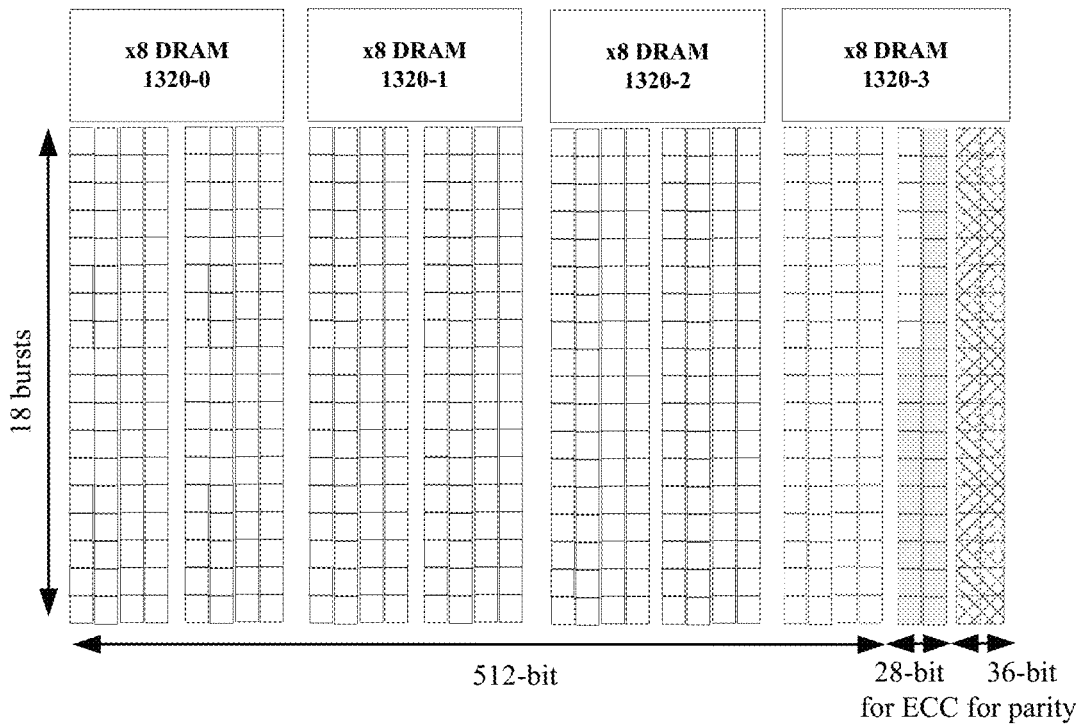
FIG. 13

1500

GENERATE A FIRST CODEWORD THAT INCLUDES A FIRST NUMBER OF DATA BITS AND A SECOND NUMBER OF ECC BITS, THE DATA AND ECC BITS OF THE FIRST CODEWORD TO BE STORED TO A PLURALITY OF MEMORY DEVICES, THE PLURALITY OF MEMORY DEVICES SEPARATELY HAVING AT LEAST 2 SETS OF DQs VIA WHICH STORED BITS ARE ACCESSED IN MULTIPLE BURSTS
1502

GENERATE A SECOND CODEWORD THAT INCLUDES THE DATA AND ECC BITS OF THE FIRST CODEWORD AND A THIRD NUMBER OF PARITY BITS, EACH PARITY BIT GENERATED BASED ON A BITWISE XOR OF 1 BIT FROM EACH SET OF 2 DQS VIA WHICH BITS FROM AMONG THE FIRST NUMBER OF DATA BITS AND AMONG THE SECOND NUMBER OF ECC BITS ARE ACCESSED, THE PARITY BITS TO BE STORED TO A MEMORY DEVICE AMONG THE PLURALITY OF MEMORY DEVICES, THE PARITY BITS ACCESSED VIA AT LEAST 1 SET OF 2 DQS INCLUDED IN THE MEMORY DEVICE
1504

CAUSE THE DATA, ECC AND PARITY BITS INCLUDED IN THE FIRST AND SECOND CODEWORDS TO BE STORED TO THE PLURALITY OF MEMORY DEVICES
1506

FIG. 15

Storage Medium *1600*

Computer Executable Instructions for *1500*

FIG. 16

TECHNIQUES TO IMPLEMENT A HYBRID ERROR CORRECTION CODE SCHEME

TECHNICAL FIELD

Examples described herein are generally related to techniques to implement an error correction codeword scheme to protect data stored to a memory from both hard and random bit errors.

BACKGROUND

Error correction of data retrieved from a memory may include use of an error correction code (ECC) scheme. The ECC scheme may include use of ECC encoded codewords to protect data or recover from errors related to data retrieved or read from the memory. ECC encoded data read from the memory may be able to identify and correct a given number of errors (e.g., bit errors). In some ECC schemes, ECC encoded data may include codewords having a combination of data and ECC parity. One such ECC scheme may be based on a double error correction, triple error detection (DEC-TED) code that utilizes a Bose-Chaundhuri-Hocquegnhem (BCH) code algorithm. Other ECC schemes may include use of other types of ECC code algorithms such as Reed-Solomon (RS) code algorithms.

BRIEF DESCRIPTION OF THE DRAWINGS

FIG. 2 illustrates example ECC schemes.
FIG. 7 illustrates an example parity scheme.
FIG. 10 illustrates example parity schemes.
FIG. 11 illustrate second and third example hybrid ECC schemes.
FIG. 12 illustrates fourth and fifth example hybrid ECC schemes.
FIG. 13 illustrates sixth and seventh example hybrid ECC schemes.
FIG. 15 illustrates an example logic flow.
FIG. 16 illustrates an example of a storage medium.

DETAILED DESCRIPTION

An emerging technology that is optimized for graph applications may be referred to as Programmable Unified Memory Architecture (PUMA). PUMA is designed around an instruction set processor that utilize 8-byte memory transactions to take advantage of fine-grained random memory accesses. A PUMA memory subsystem may be designed to have 8-bit memory access channels as compared to 64-bit memory access channels used in commodity memory subsystems such as memory subsystems that include dual in-line memory modules (DIMMs). In some examples, memory devices designed to operate in accordance with double data rate (DDR) memory technologies published by JEDEC (Joint Electronic Device Council), such as DDR4 (DDR4 version 4, JESD79-4, originally published in September 2012). These DDR4 memory devices have a burst length of 8 (BL8) in which one memory access transfers data over an 8-bit memory channel 8 times. Also, memory devices designed to operate in accordance with the recently released DDR5 JEDEC standard (DDR version 5, JESD79-5, originally published in July 2020) can have a burst length of 16 (BL16). Therefore, a single ×4 DDR5 memory device (e.g., 4 bits per burst) with a BL16 can enable 64 bit or 8B memory accesses.

In some examples, a described more below, various different types of ECC schemes may be implemented to protect data written to either narrow memory channels utilized by PUMA or wider memory channels utilized by memory subsystems including DIMMs. Also as described more below, a hybrid ECC scheme will be described that mitigates various limitations of traditional ECC schemes and/or limitations associated with memory die configurations that may be utilized in PUMA or DIMM memory subsystems.

Figure 1:
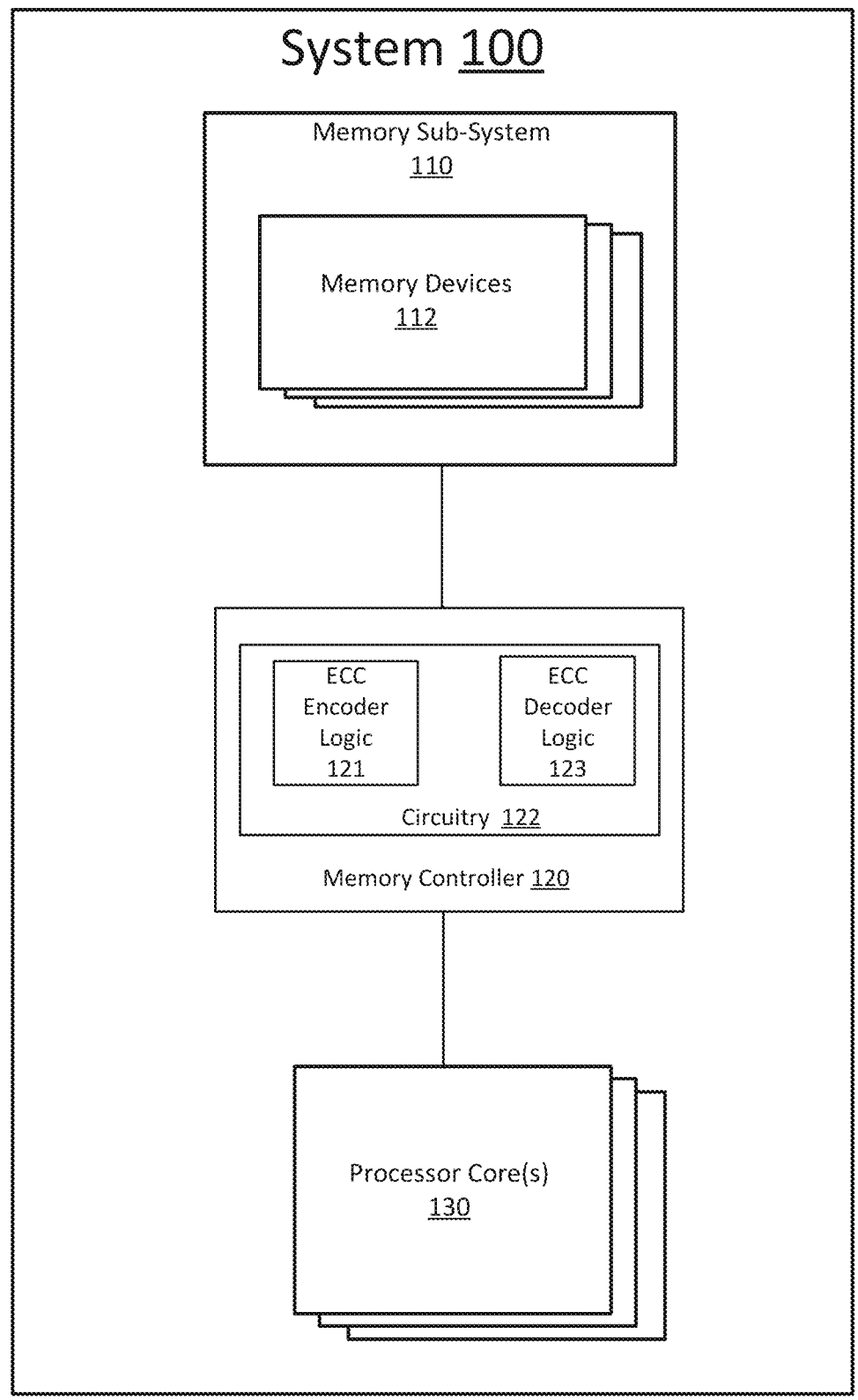
FIG. 1 illustrates an example first system.

FIG. 1 illustrates an example system 100. As shown in FIG. 1, system 100 includes a memory sub-system 110, a memory controller 120 and processor core(s) 130. In some examples, memory sub-system 110 may be called storage or compute data storage and may include computer components and storage media to keep digital data. As shown in FIG. 1, in some examples, memory sub-system may include memory devices 112. Memory devices 112 may include non-volatile and/or volatile types of memory.

In examples where volatile types of memory are included in memory devices 112, the volatile types of memory may include, but are not limited to, random-access memory (RAM), Dynamic RAM (DRAM), double data rate synchronous dynamic RAM (DDR SDRAM), static random-access memory (SRAM), thyristor RAM (T-RAM) or zero-capacitor RAM (Z-RAM). In some examples, memory devices 112 including volatile types of memory may operate in accordance with various memory technologies, such as, but not limited to DDR4 or DDR5 memory technologies.

In examples where non-volatile types of memory are included in memory devices 112, the non-volatile types of memory may include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

According to some examples, memory devices 112 may be integrated in a traditional horizontal or planar configuration or configured n a die-stacking configuration. Die-stacking, also known as chip stacking or vertical integration, may include a process of mounting multiple chips vertically to increase an amount of memory devices included in a single semiconductor package to achieve better electrical performance with shorter routing of interconnections between memory devices 112. Die-stacking may be applied to both volatile and non-volatile types of memory.

In some examples, memory controller 120 may be configured to provide an interface to memory sub-system 110 and manage a flow of data going to and from memory devices 112. In some examples, memory controller 120 may be in the form of a separate chip or integrated with memory sub-system 110. In other examples, memory controller 120 may be implemented on a motherboard or form an integrated memory controller (IMC) with processor core(s) 130.

According to some examples, as shown in FIG. 1, memory controller 120 may include circuitry 122 to support or implement an ECC encoder logic 121 and an ECC decoder logic 123. In some examples, data bit errors may be introduced during transmission in a noisy memory channel used to access memory devices 112. In other examples, as mentioned in more detail below, data bit errors may be introduced in storage media due to possible defects in one or more components of a memory device and/or random bit errors. Also described more below, example hybrid ECC schemes may be implemented by logic and/or features of a memory controller such as ECC encoder logic 121 and ECC decoder logic 123 to protect data stored to memory devices such as memory devices 112 from these types of bit errors and improve reliability, availability and serviceability (RAS) of data stored to memory devices.

In some examples, processor core(s) 130 may include one or more central processing units (CPU) or cores wherein each core can read and execute CPU instructions such as add, move, branch, read, write, and so forth. With multiple cores integrated onto a single integrated circuit die or multiple dies in a single chip package, a multi-core processor is amenable to parallel computing, thus increasing overall computing speed. Processor core(s) 130 and memory controller 120, in some examples, may be included in a PUMA-type implementation that includes processor core(s) 130 functioning as instruction set processors that may utilize 8-byte memory transactions to memory devices 112 of memory sub-system 110.

FIG. 2 illustrates an example ECC schemes 200. In some examples, as shown in FIG. 2, ECC schemes 200 include a DIMM-based channel scheme 210 a single-rank narrow channel scheme 220 and a dual-rank narrow channel scheme 230. For these examples, each scheme utilizes ×4 memory devices to maintain data and ECC parity bits. For example, DIMM-based channel scheme 210 has 16×4 memory devices to maintain data bits and 2×4 memory devices to maintain ECC parity bits to protect a 64b memory channel with 8b ECC parity. Also, single-rank narrow channel scheme 220 has 2×4 memory devices for data bits and 1×4 memory device for ECC parity bits to protect an 8b wide memory channel with 4b ECC parity. Also, dual-rank narrow channel scheme 230 has 2×4 memory devices for data bits and 1×4 memory device for ECC parity for each rank to protect an 8b wide memory channel with 4b ECC parity. The various prior art ECC schemes 200 shown in FIG. 2 illustrate how memory devices may be arranged in wide and narrow type memory channels.

Figure 3:
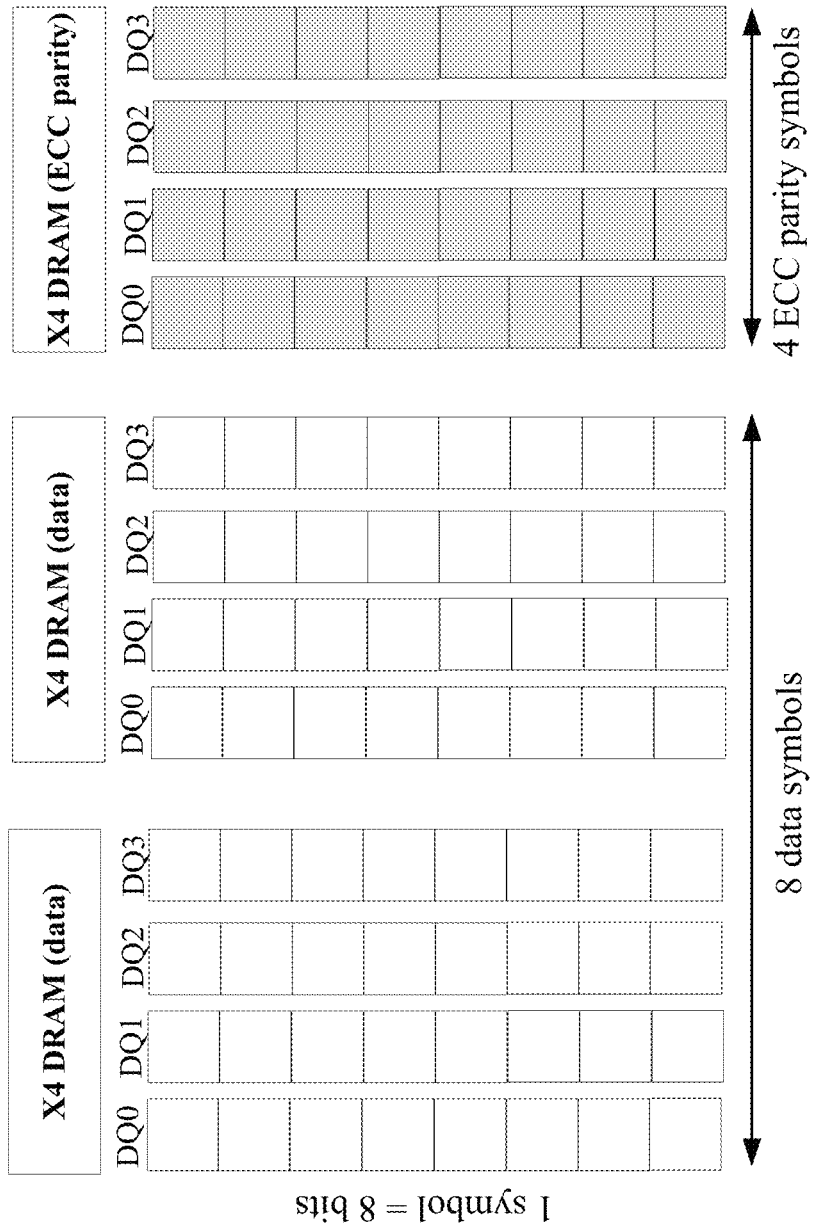
FIG. 3 illustrates an example Reed-Solomon code scheme.

FIG. 3 illustrates an example Reed-Solomon (RS) code 300. In some examples, RS code 300 may be utilized in either single-rank narrow channel scheme 220 or dual-rank narrow channel scheme 230 that includes ×4 DRAM memory devices. So, as shown in FIG. 3, 2×4 DRAM devices for data and 1×4 DRAM device for ECC parity, each having respective data pins (DQs) DQ0 to DQ3 to place bits representing either data or ECC parity (shaded boxes) on a memory channel.

According to some examples, RS code 300 may treat a block (group) of data as a set of finite field elements called symbols. For example, a block of 96 bits can be treated as a set of 12 8-bit symbols. If payload data are 8 symbols and ECC parities are 4 symbols, the RS code can correct up to 2-symbol errors or detect 4-symbol errors. Also, 1-symbol correction and 3-symbol detection can be enabled with the same number of ECC parity symbols in the given codeword. The codeword configuration for the RS code in the narrow channel is depicted in FIG. 2. In this case, if the symbol consists of the 8 bits in the same DQ as shown in FIG. 2, up to a two-pin (2 DQ) errors can be corrected using RS code scheme 300.

Figure 4:
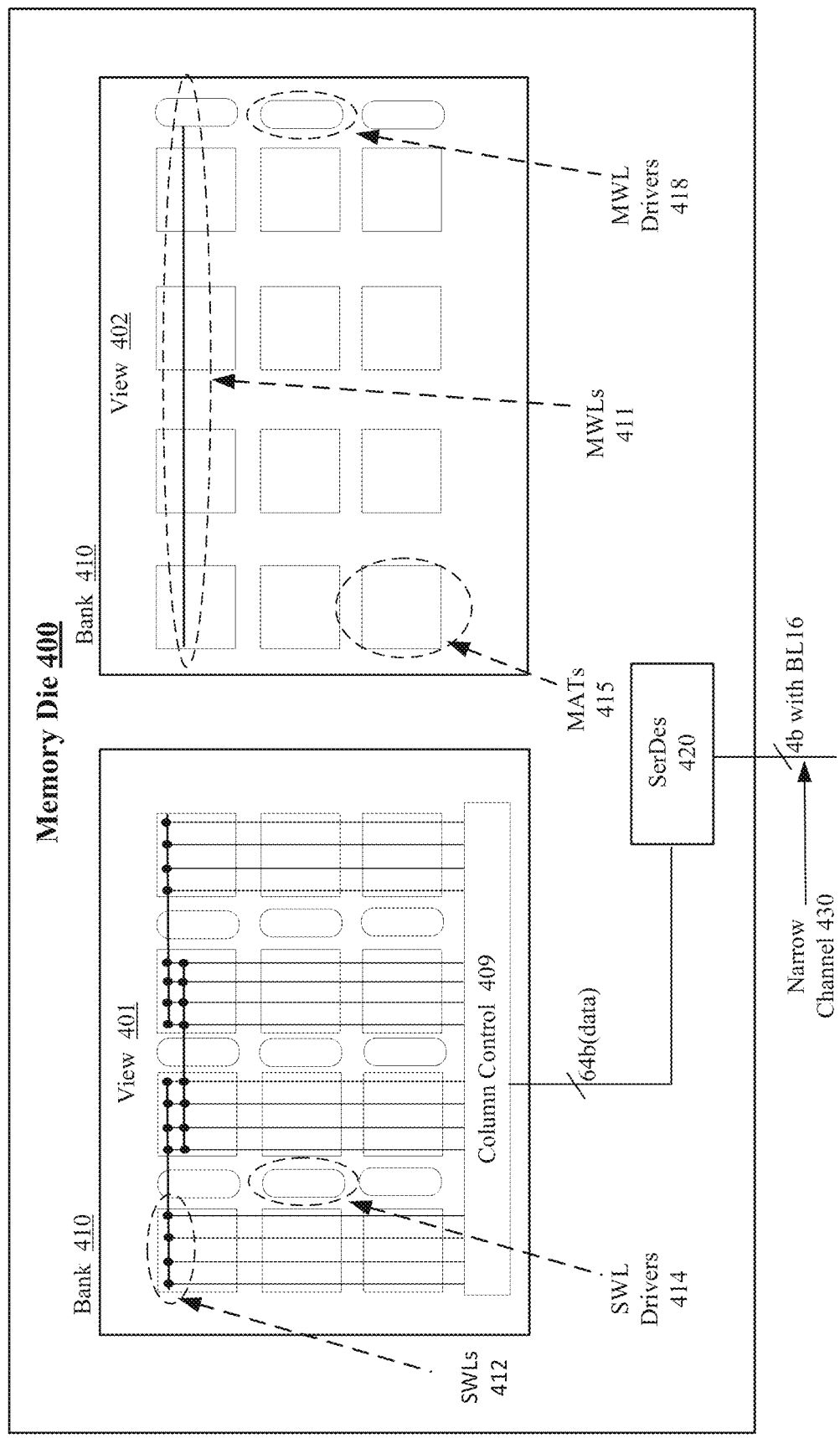
FIG. 4 illustrates an example memory die.

FIG. 4 illustrates example memory die 400. In some examples, as shown in FIG. 4, two views, view 401 and view 402 are shown of a bank 410. Memory die 400, in some examples, may be DRAM memory die and bank 410 may represent one of a plurality of banks for the DRAM memory die. For these examples, each bank may have multiple small memory arrays or MATs that are depicted in views 401 and 402 as MATs 415. In addition, word-lines for bank 410 may have a hierarchy, where a main word-line (MWL) is segmented into multiple sub word-lines (SWLs). View 402 shows an example MWL 411 and view 401 shows an example of SWLs 412 corresponding to MWL 411.

According to some examples, as shown in FIG. 4, SWL drivers 414 may be located between MATs 415. For these examples, SWL drivers 414 may drive SWLs on both sides in a staggered manner. Also, view 402 depicts MWL drivers 418 to drive respective MWLs 411. A serializer/deserializer (SERDES) 420 may be arranged to enable 64b of data to be routed from a column control 409 of bank 410 to narrow channel 430 based on a 4b channel width and a burst length (BL) of 16.

Figure 5:
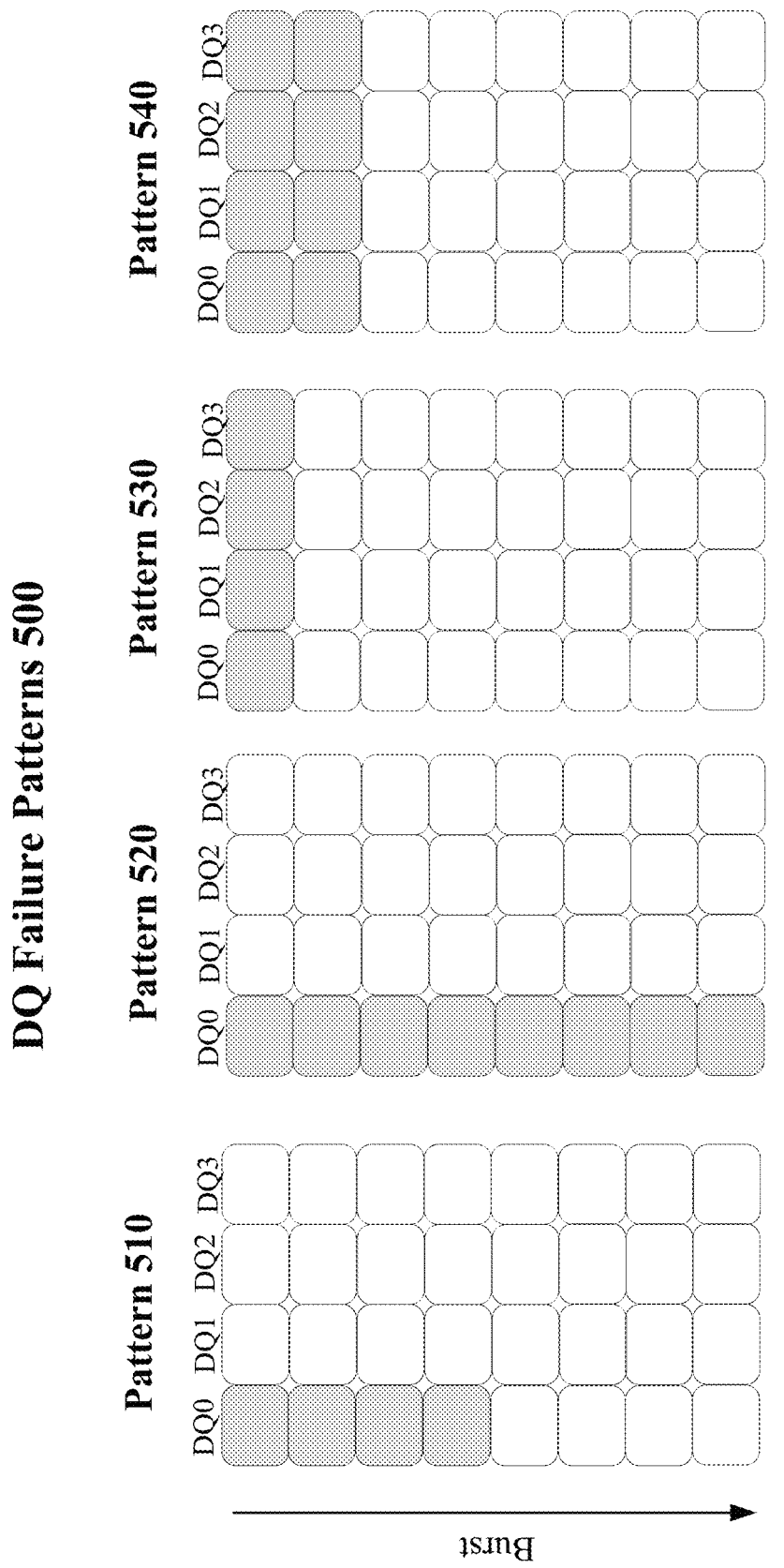
FIG. 5 illustrates example DQ failure patterns.

FIG. 5 illustrates example DQ failure patterns 500. Some common DRAM failure patterns for a ×4 DRAM die may include a single bit, a bit line, a word line, a sub word line, a DQ, a bank and a chip failure. Single bit and bit line failures affect one bit per row. Bank and chip failures affect all bits which come from a same die, that is all 32 bits (e.g., 4 symbols of 8b each). If an error location is unknown, with only one ECC die (4 ECC symbols), a bank or a chip error is uncorrectable. So, FIG. 5 shows a focus on multi-bit errors which is less than 32 bits. For example, error patterns 510 and 530 show a 4b error pattern and error patterns 520 and 540 show an 8b error pattern.

According to some examples, error patterns 510 to 540 are associated with hard failures in a ×4 DRAM die for SWL and one or more DQ failures. One SWL driver failure, for example, can make either the defect on SWL driven at a first side of the SWL driver or SWL driven at both sides of the SWL driver. In addition, depending on memory manufactures and memory parts, the same SWL driver failure can yield different error patterns. For example, one SWL in a DRAM bank may provide either 4 bits or 8 bits. Also, error bits can appear on only one DQ or multiple DQs because each DRAM part from different memory manufactures may have different internal connections from the one SWL to a DQ. Although the example RS code scheme 300 shown in FIG. 3 can correct up to 16 bits (if errors fall within 2 symbols), the fixed ECC configuration of RS code scheme 300 limits its error correction capability. For example, a given symbol shown in FIG. 3 may be comprised of 8 bits for one DQ. In this example, error patterns 510 and 520 representing a single DQ pattern may be detected and corrected by RS code scheme 300, but the latter two error patterns 530 and 540 cannot be detected by RS code scheme 300. However, depending on vendors and their parts, errors patterns caused by SWL failures can fall into error patterns 530 and 540 (multiple DQ pattern).

RS code scheme 300 can correct any two symbol errors (up to 16 bits). Thus, even if all error patterns cannot be detected, RS code scheme may be able to correct error patterns 510 to 540 shown in FIG. 5. However, two scenarios where RS code scheme 300 cannot detect and correct the errors may occur: 1.) If random bit errors happen along with hard errors depicted in error patterns 510 to 540; and 2.) Starting with DDR5 memory devices, vendors will implement on-die ECC to correct single-bit errors. However, the on-die ECC is unable to correct multi-bit errors, instead, the on-die ECC may cause a false correction by flipping another bit that is mapped to a different symbol. As described more below, a hybrid ECC scheme that uses a combination of a double error correction, triple error detection (DEC-TED) codeword and a parity codeword is disclosed that may be capable of handling all four different types of error patterns shown in FIG. 5 as well as capable of handling random bit errors and false corrections by on-die ECC for DDR5 DRAM memory devices.

Figure 6:
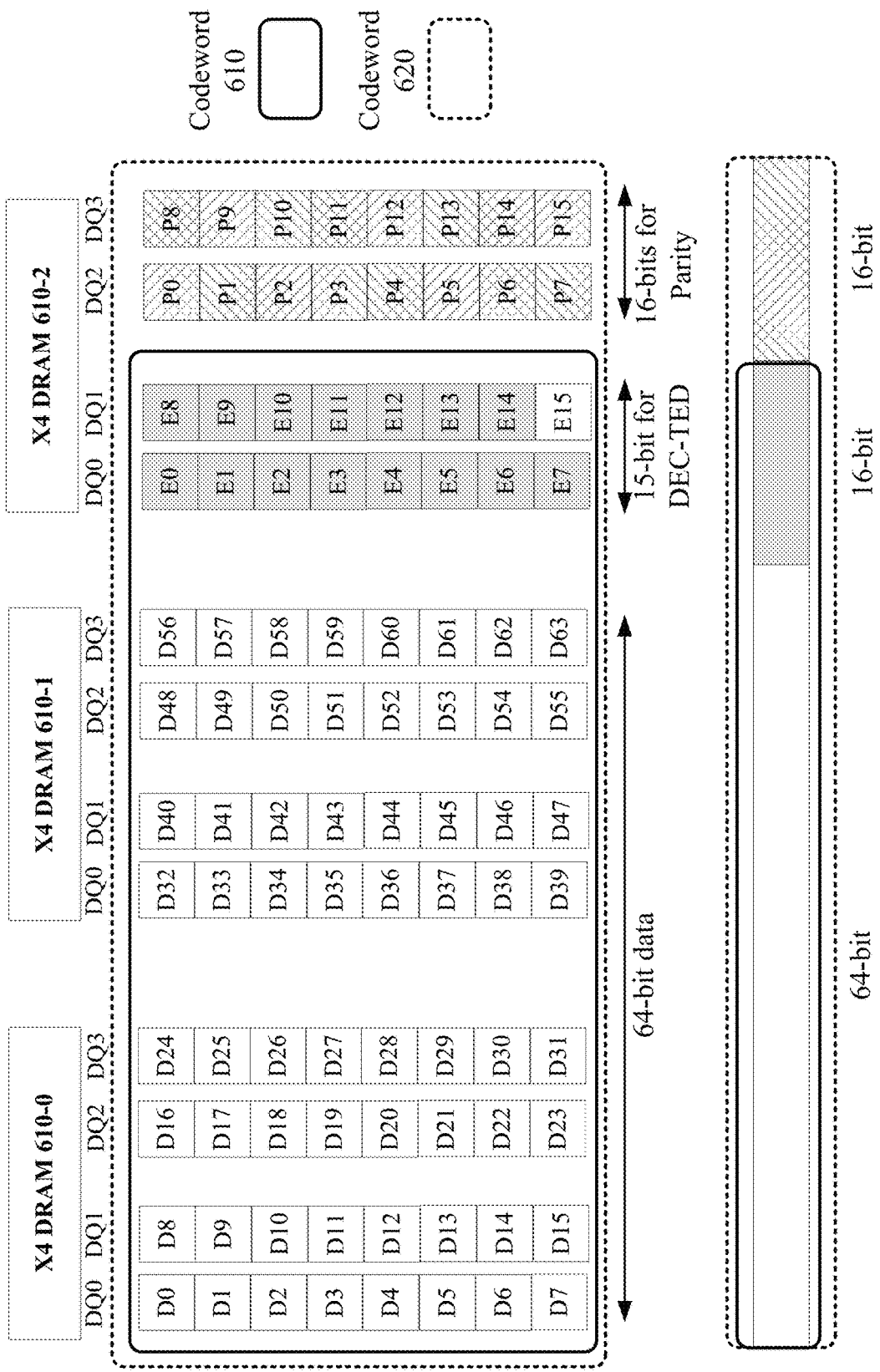
FIG. 6 illustrates an example hybrid ECC scheme.

FIG. 6 illustrates an example hybrid ECC scheme 600. In some examples, hybrid ECC scheme 600 may provide detection/correction for hard errors plus random bit errors via use of a first codeword 610 (solid-lined box) that includes 64 bits for data and 16 bits for ECC, the 16 bits for ECC associated with a DEC-TED code (e.g., that utilizes a BCH code correction algorithm). On top of codeword 610, even/odd parity protects a second codeword 620 (dashed-line box) which includes the 64 bits for data, the 16 bits ECC and 16 bits for parity.

In some examples, as shown in FIG. 6, hybrid ECC scheme 600 may be implemented for storage of data, ECC and parity bits in x4 DRAMs 610-0, 610-1 and 610-2. For these examples, x4 DRAMs 610-0, 610-1 and 610-2 each include four DQs. The x4 DRAMs 610-0 to 610-2 may be DDR4 memory devices and each DQ may be utilized to separately access 8 bits based on a memory access burst length of 8. The 64 bits for data included in codewords 610 and 620 are shown in FIG. 6 as D0 to D63 and, in some examples, may be accessed via DQ0 to DQ3 of x4 DRAM 610-0 and x4 DRAM 610-1. The 16 bits for ECC parity included in codewords 610 and 620 are shown in FIG. 6 as E0 to E15 and, in some examples, may be accessed via DQ0 and DQ1 of x4 DRAM 610-2. The 16 bits for parity included in codeword 620 are shown in FIG. 6 as P0 to P15 and, in some examples, may be accessed via DQ2 and DQ3 of x4 DRAM 610-3.

According to some examples, the 16 bits for ECC may include use of only 15 bits to support a DEC-TED code in order to correct and detect errors in 64 bits of data. For these examples, FIG. 6 shows a grey shading for the 15 bits (E0 to E14) used to support the DEC-TED code. The 16$^{th}$ bit (E15) has no shading to indicate it can be used for other purposes (e.g., a 1 metadata bit). Also, the 16 bits for parity may be generated by data and ECC bits as described in more detail below.

A common type of DEC-TED code may implement a BCH code detection/correction algorithm. BCH code algorithms form a class of cyclic error-correcting codes constructed using finite fields. BCH code algorithms were first developed on or about 1959 by Hocquenghem, Bose and Ray-Chaudhuri where the name of these code algorithms comprises the initials of the inventors. Equation (1) below shows a standard H-matrix for conventional BCH code. A person skilled in the art may appreciate that the first row of all 1xs are essentially an overall parity. With overall parity bit in the syndrome, odd errors may be distinguished from even errors automatically.

$$H_1 = \begin{bmatrix} 1 & 1 & 1 & 1 & \ldots & 1 & \ldots & 1 \\ 1 & \alpha & \alpha^2 & \alpha^3 & \ldots & \alpha^i & \ldots & \alpha^{(N-2)} \\ 1 & \alpha^3 & \alpha^6 & \alpha^9 & \ldots & \alpha^{3i} & \ldots & \alpha^{3(N-2)} \end{bmatrix} \quad (1)$$

Each column in equation (1) may be treated as an element, and the H-matrix in equation (1) may be rewritten into equation (2) below.

$$H_1 = [h_0\ h_1\ h_2\ h_3\ \ldots\ h_i\ \ldots\ h_{N-2}], \text{ where}$$
$$h_i = [1, a^i, a^{3i}]^{-1} \quad (2)$$

The H-matrix in above equations (1) and (2) may be used to calculate the syndrome of codeword 610. Any valid or error free codeword 610 will have a 0 syndrome. A non-zero syndrome calculated for codeword 610 means the codeword is invalid, and the value of calculated syndrome is related to error bits in codeword 610. More specifically, in a linear code, the error syndrome equals to the sum of H-matrix columns that corresponds to the error bits. For example, if there are three errors at bit position of i, j and k, the syndrome would equal to $h_i+h_j+h_k$.

FIG. 7 illustrates an example parity scheme 700. According to some examples, parity scheme 700 is used to generate the 16 parity bits of P0 to P15 included in codeword 620. For these examples, bits from each set of 2 DQs (total 16 bits) including data or ECC parity bits may be bitwise combined with bits from other 2 DQ sets that include data and ECC parity bits to generate P0 to P15. For example, as shown in FIG. 7 for parity 705, a P0 bit may be generated by a bitwise exclusive or (XOR) of bits for D0, D16, D32, D48 and E0, a P1 bit may be generated by a bitwise XOR of bits for D1, D17, D33, D49 and E1 and a same pattern of bitwise XORing occurs such that a P8 bit may be generated by a bitwise XOR of bits D8, D24, D40, D56 and E8. Any odd number of bit errors in D0, D16, D32, D48, E0 and P0 may be detected with its syndrome S0 as shown in FIG. 7 for parity syndrome 710. Also, syndromes S1 and S8 may be used to detect any odd number of bit errors in a similar manner. However, this simple parity method cannot specify a location of detected error bits. Thus, use of the DEC-TED code as shown in FIG. 6 for codeword 610 is combined with this simple parity method to identify the error location and provide further error detectability/correctability.

Figure 8:
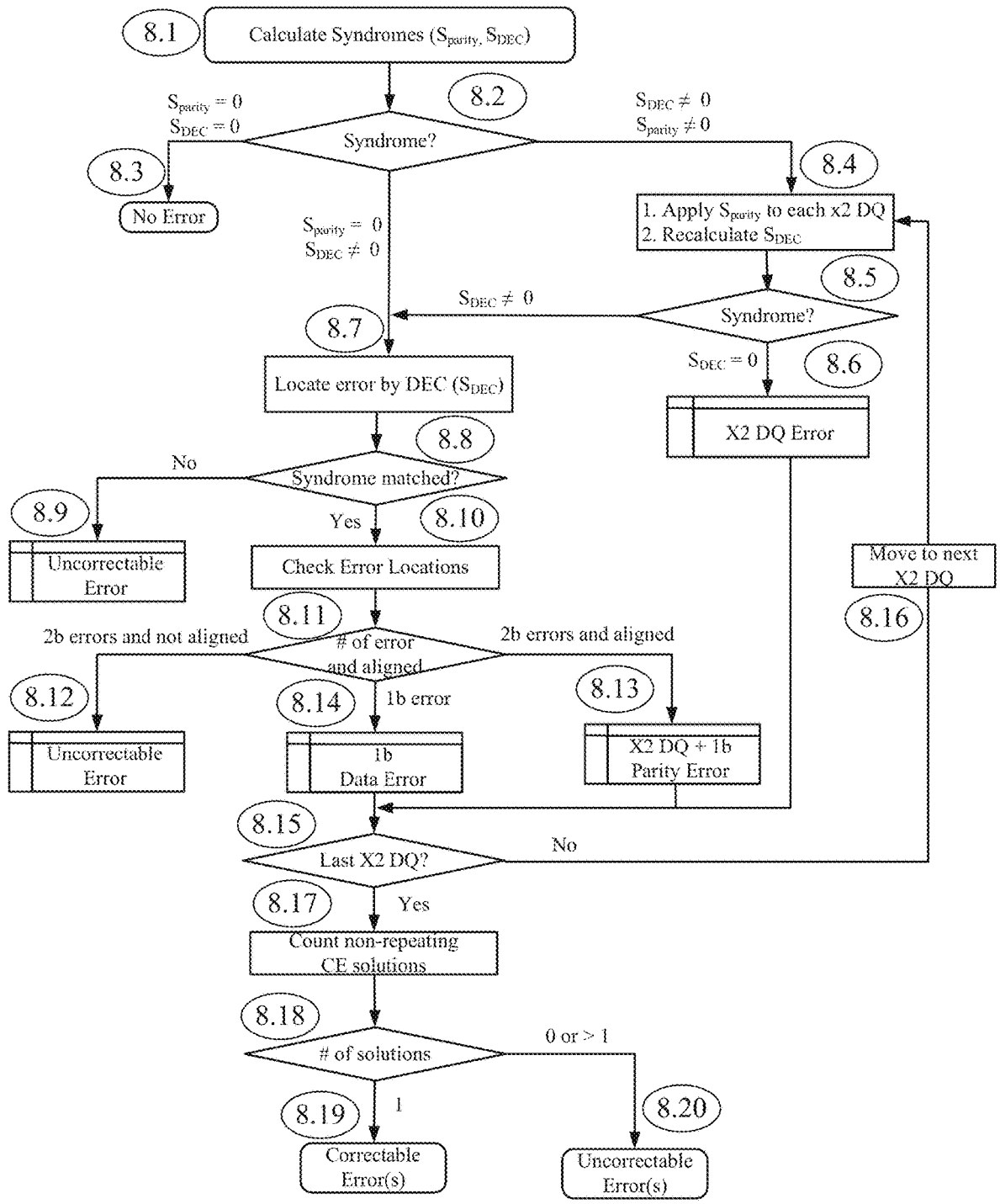
FIG. 8 illustrates an example process.

FIG. 8 illustrates an example process 800. Process 800 shows an overall flow of an error detection and correction process for a hybrid ECC scheme such as hybrid ECC scheme 600 that includes codewords 610 and 620 stored to x4 DRAMS 610-0 to 610-2 as shown in FIG. 6. In some examples, logic and/or features of a memory controller, such as an ECC decoder logic 123 of memory controller 120, may implement process 800. Examples are not limited to logic and/or features of a memory controller such as ECC decoder logic. Also, other types of logic such as an application specific integrated circuitry (ASIC) or programmable logic (e.g., an FPGA) coupled with the memory controller may implement all or at least some of process 800. Process 800 may also apply to other hybrid ECC schemes that may be based on use of more DRAM devices than what is shown as being used for hybrid ECC scheme 600. The other hybrid ECC schemes may be based on wider memory channel ×8 DRAM devices that may be accessed using various burst lengths (e.g., 16BL or 18BL). These other hybrid ECC schemes are described in more detail below.

Beginning at 8.1, syndromes are calculated for codeword 610 ($S_{DEC}$) and for codeword 620 ($S_{parity}$).

Moving to 8.2, a determination is made as to whether the separately calculated syndromes=0. If both syndromes=0, the process 800 moves to 8.3. If $S_{DEC}$ and $S_{parity}$ for codeword 620 are both≠0, the process 800 moves to 8.4. If both $S_{parity}$=0 and $S_{DEC}$≠0, the process 800 moves to 8.7.

Moving from 8.2 to 8.3, since a determination is made that both syndromes=0, codeword 610 and codeword 620 have no errors. Process 800 may then come to an end as no further correction actions are needed.

Moving from 8.2 to 8.4, $S_{parity}$ may be applied to separate sets of 2 DQs (e.g. each ×2 DQ) to attempt to correct bit errors within the separate sets of 2 DQs of codeword 620. For example, $S_{parity}$ may be first applied to DQ0 and DQ1 of ×4 DRAM 610-0 to correct bit errors in data bits D0 to D15. The syndrome for codeword 610 ($S_{DEC}$) may then be recalculated after $S_{parity}$ is applied to this first set of 2 DQs of codeword 620.

Moving to 8.5, a determination is made whether the recalculated syndrome for codeword 610 is equal to zero. If $S_{DEC}$ for codeword 610 is ≠0, process 800 moves to 8.7. If $S_{DEC}$ for codeword 610 is =0, process 800 moves to 8.6.

Moving from 8.5 to 8.6, since a determination was made that $S_{DEC}$ for codeword 610 was equal to zero, the application of $S_{parity}$ to the set of 2 DQs was able to correct a bit error in this set of 2 DQs. 8.6 is an example of a correctable error solution for this set of ×2 DQs being evaluated for correctable errors.

Moving from 8.5 to 8.7, since $S_{parity}$=0 and $S_{DEC}$≠0, double error correction (DEC) capabilities of codeword 610 are used to locate bit errors. For example, a BCH code algorithm is used to determine bit error positions within D0 to D63 of codeword 610.

Moving to 8.8, a determination is made whether $S_{DEC}$ for codeword 610 calculated at 8.2 matches the recalculated $S_{DEC}$ of 8.4. Also, if $S_{DEC}$ was not recalculated (e.g., $S_{parity}$=0 and $S_{DEC}$≠0 at 8.2), syndromes are considered as matched. If the syndromes do not match, process 800 moves to 8.9. If the syndromes match, process 800 moves to 8.10.

Moving from 8.8 to 8.9, since the separately calculated syndromes do not match, codeword 610 is determined to include one or more uncorrectable errors. In other words, application of $S_{DEC}$ for codeword 610 is unable to correct errors even if $S_{parity}$ from codeword 620 has been previously applied. Process 800 may then come to an end.

Moving from 8.8 to 8.10, error locations identified from application of $S_{DEC}$ are checked within bits for D0 to D63 of codeword 610 to determine a relative location of bit errors within each DQ. For example, relative location in respective DQ0 to DQ3 of ×4 DRAMs 610-0 and 610-1 via which bits for D0 to D63 were accessed.

Moving to 8.11, a determination is made of the number of bit errors located and whether the bit errors in codeword 610 are in relative alignment. For example, a located bit error of a bit for D6 accessed via DQ0 of ×4 DRAM 610-0 is in alignment with a located bit error of a bit for D38 accessed via DQ0 of ×4 DRAM 610-1. Alternatively, a located bit error of a bit for D6 accessed via DQ0 of ×4 DRAM 610-0 is not in alignment with another located bit error of bits for any one of D32 to D37 and D39 accessed via DQ0 of ×4 DRAM 610-1. If 2 bit errors are located and the bit errors are not aligned, process 800 moves to 8.12. If 2 bit errors are located and the bit errors are aligned, process 800 moves to 8.13. If a single bit error is located, process 800 moves to 8.14.

Moving from 8.11 to 8.12, since 2 bit errors were located and the located bit errors lack alignment in codeword 610, the bit errors are uncorrectable. If parity scheme 700 was used to determine parity bits, lack of alignment negates an ability to use parity bits of codeword 620 to correct the unaligned bit errors. Process 800 may then come to an end.

Moving from 8.11 to 8.13, since 2 bit errors were in alignment, the parity bits of codeword 620 may be used correct the aligned located bit errors of bits for D0 to D63. 8.13 is an example of a correctable error solution for the set of ×2 DQs being evaluated for correctable errors.

Moving from 8.11 to 8.14, since 1 bit error was located, alignment is not applicable. The 1 bit error is located within a bit for any one of bits for D0 to D63. Also, since $S_{parity}$ was initially determined back in 8.2 as =0, no parity error was detected for codeword 620, thus the 1b detected error is a data bit error. 8.14 is an example of a correctable error solution for the set of ×2 DQs being evaluated for correctable errors.

Moving from either 8.6, 8.13 or 8.14 to 8.15, a determination is made as to whether the current set of 2× DQs are the last set of ×2 DQs to be evaluated. For example, if DQ2 and DQ3 of ×4 DRAM 610-1 are the last set of ×2 DQs to be evaluated and the set of ×2 DQs just evaluated does not include DQ2 and DQ3, the determination is no and process 800 moves to 8.16. Otherwise, process 800 moves to 8.17.

Moving from 8.15 to 8.16, the next set of ×2 DQs are selected for evaluation and process 800 moves back to 8.4.

Moving from 8.15 to 8.17, a count of non-repeating correctable error (CE) solutions is determined for each set of ×2 DQs evaluated. In other words, if two CE solutions are found for two separate sets of ×2 DQs (e.g., reach CE solutions at 8.6, 8.13 or 8.14), that would count as two non-repeating CEs. If only one CE solution is found that counts as 1.

Moving to 8.18, the number of CE solutions are evaluated. If 1 CE solution is found, process 800 moves to 8.19. If 0 or more than 1 CE solutions are found, process 800 moves to 8.20

Moving from 8.18 to 8.19, 1 CE solution found indicates that codeword 610 has one or more correctable errors when implementing hybrid ECC scheme 600. Process 800 then comes to an end.

Moving from 8.18 to 8.20, 0 or more than 1 CE solution were found. More than 1 CE solution leads to an uncorrectable error determination based on a lack of an ability to select which of the multiple CE solutions are the actual solution to use. Process 800 then comes to an end.

Figure 9A:
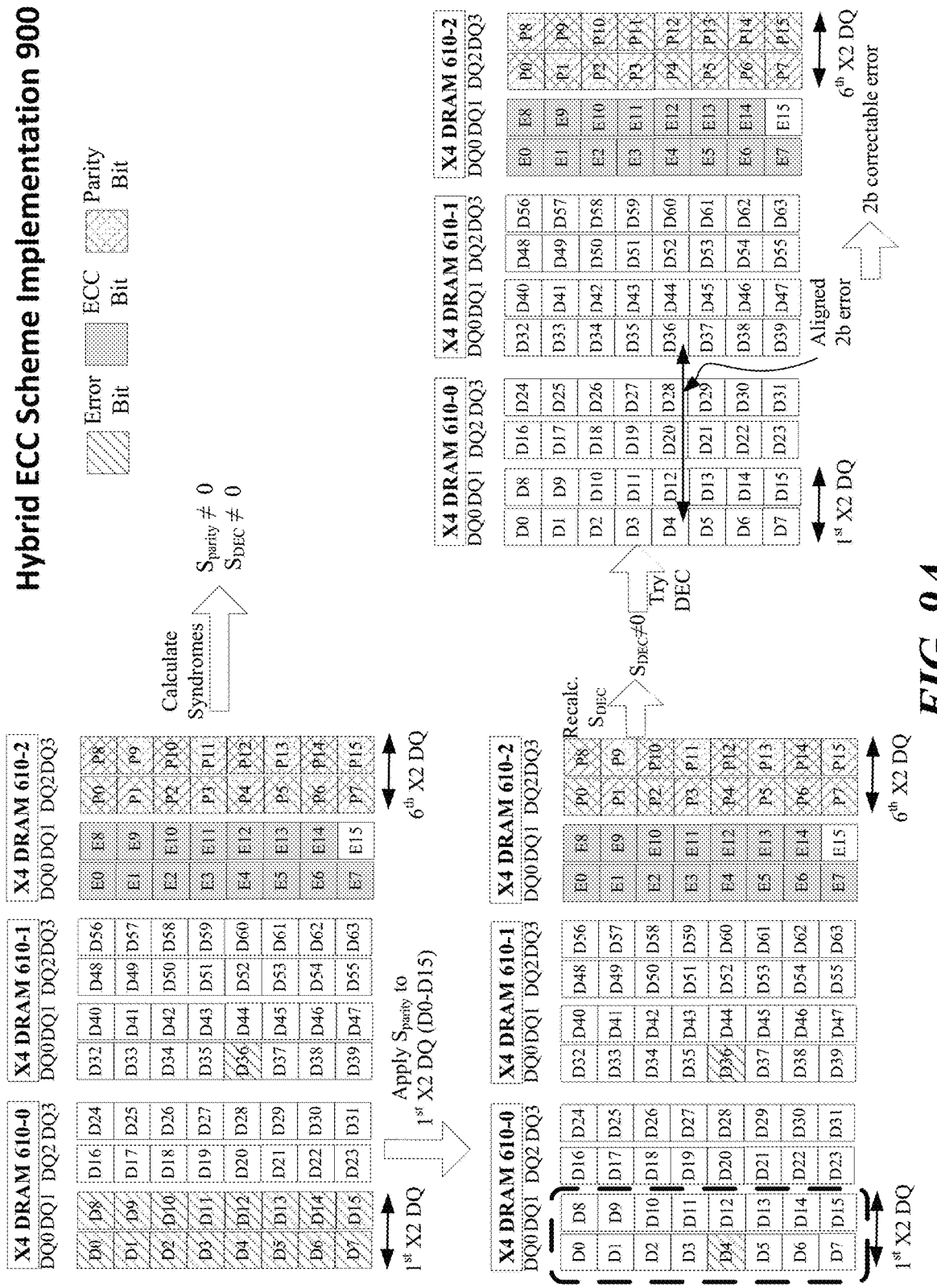
FIGS. 9A-C illustrate an example ECC scheme implementation.
Figure 9B:
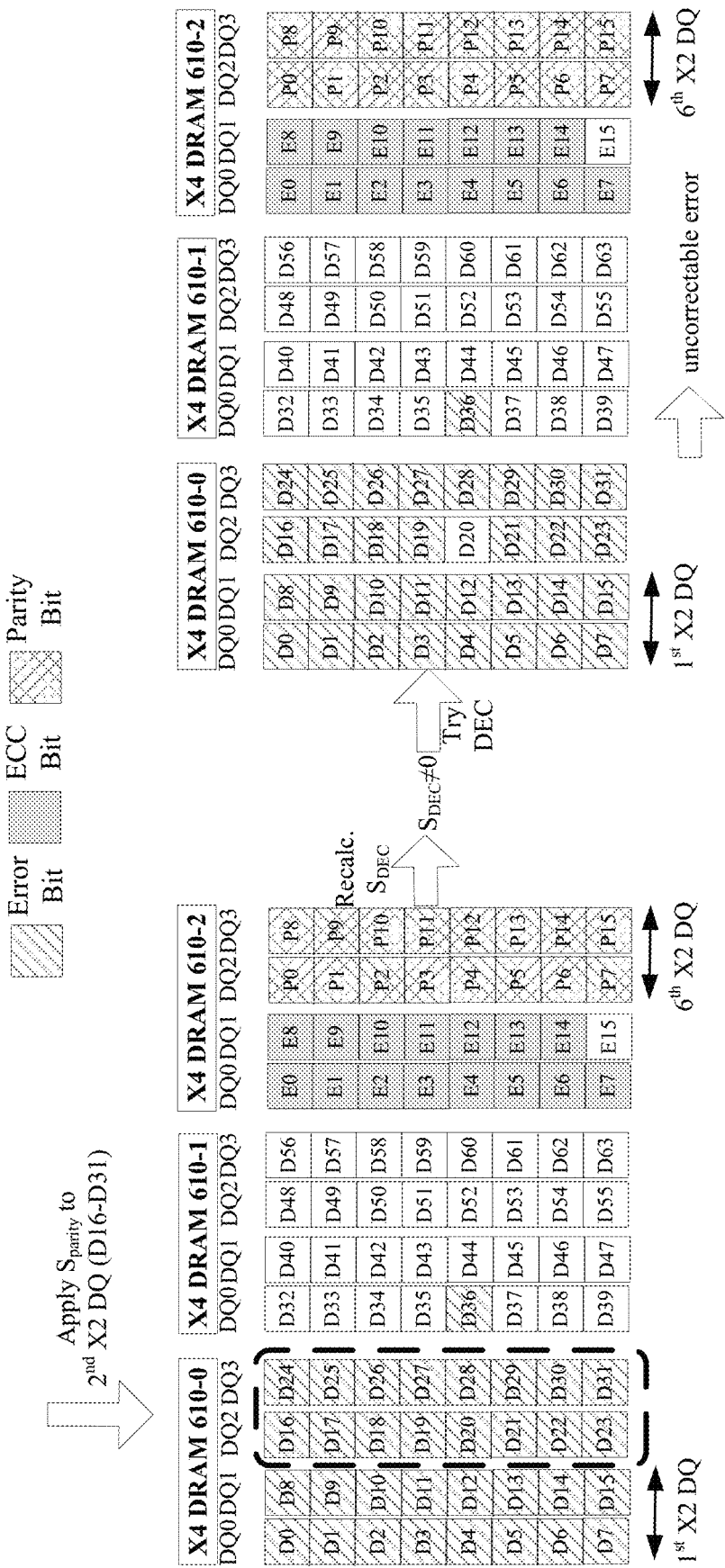
Figure 9C:
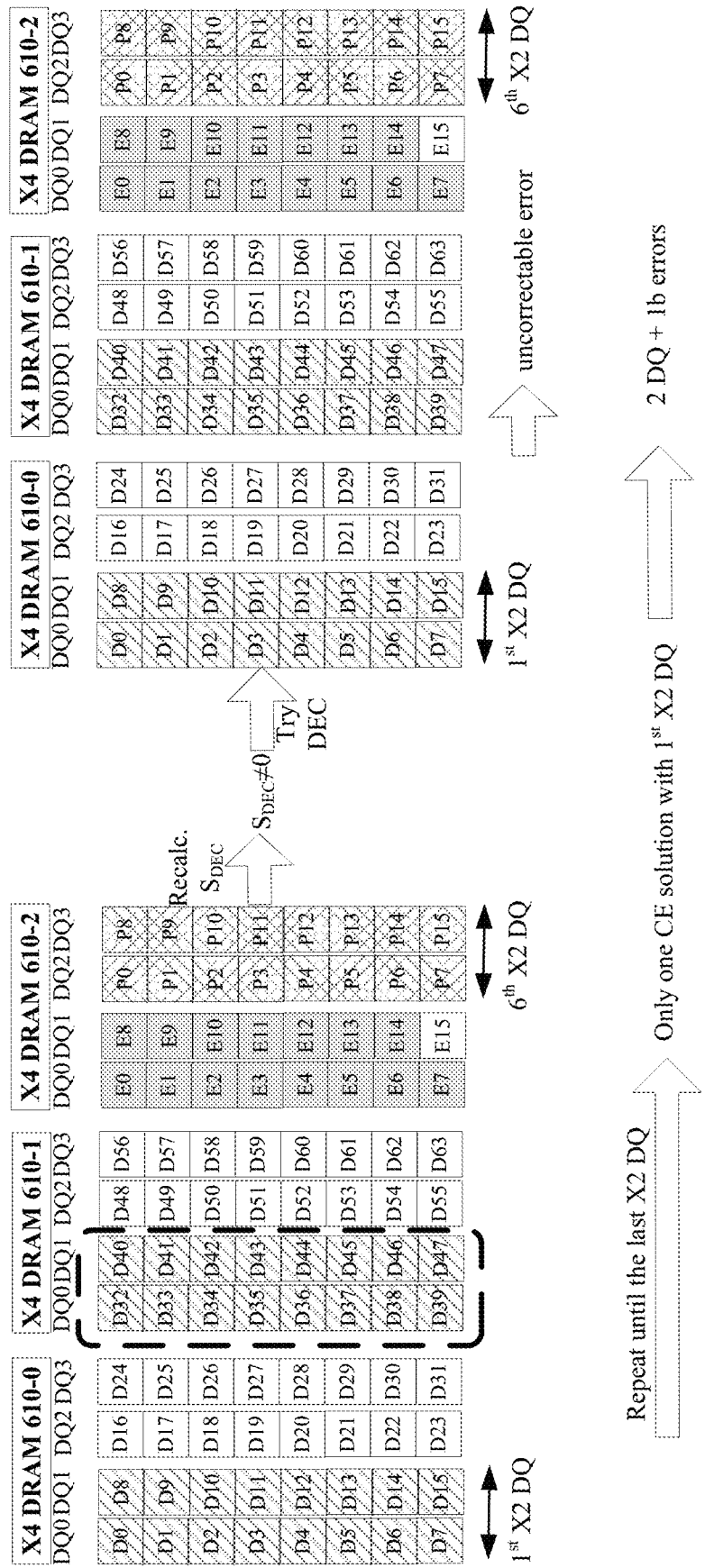

FIGS. 9A-C illustrate an example hybrid ECC scheme implementation 900. According to some examples, hybrid ECC scheme implementation 900 provides a graphical representation of finding a CE solution for correcting bit errors. Error bits are shown in FIGS. 9A-C as having angled-line patterns. ECC bits are shown in FIGS. 9A-C as having a solid grey pattern and parity bits as having a cross-hatched pattern.

According to some examples, bit errors may be caused by a hard failure such as an SWL driver failure and may also be caused by a random bit corruption of another bit in a codeword generated based on a hybrid ECC scheme such as hybrid ECC scheme 600's codeword 620 as shown in FIG. 6. For example, as shown in FIG. 9A, corrupted or error bits may be included in bits for D0 to D15 accessed via DQ0 and DQ1 of ×4 DRAM 610-0 and a random bit for D36 accessed via DQ0 of ×4 DRAM 610-1. When syndromes for $S_{parity}$ and $S_{DEC}$ are calculated, both are 0 due to the aforementioned error bits. $S_{parity}$ may be applied to the 1$^{st}$ set of ×2 DQs, which is shown in FIG. 9A as DQ0 and DQ1 of ×4 DRAM 610-0. Also, as shown in FIG. 9A, only one error bit at a bit for D4 remains after applying $S_{parity}$ to the 1$^{st}$ set of ×2 DQs, the bit error at D36 still remains. Because only two bit errors remain, DEC-TED capabilities of hybrid ECC scheme 600's codeword 610 may be utilized to detect and correct the two bit errors (e.g., based on utilizing a BCH code algorithm that incorporates use of ECC bits E0-E14). For example, as shown in FIG. 9A, after recalculating $S_{DEC}$ and finding $S_{DEC} \neq 0$, the double error correction (DEC) capabilities are used to correct the bit errors in D4 and D36. Further, based on use of parity scheme 700, detected and corrected bit errors for D4 and D36 are aligned and this makes the first application of $S_{parity}$ of the 1$^{st}$ set of ×2 DQs followed by recalculating $S_{DEC}$ to locate and correct the 2 bit errors as providing a correctable error (CE) solution.

In some examples, as shown in FIG. 9B, $S_{parity}$ may be applied to the 2$^{nd}$ set of ×2 DQs, which is shown in FIG. 9B as DQ2 and DQ3 of ×4 DRAM 610-0. However, errors still remain in the 1$^{st}$ set of ×2 DQs and recalculating $S_{DE}C$ to locate and correct bit errors does not provide a CE solution as the number of bit errors exceeds 2 bits.

According to some examples, as shown in FIG. 9C, $S_{parity}$ may be applied to the 3$^{rd}$ set of ×2 DQs, which is shown in FIG. 9B as DQ0 and DQ1 of ×4 DRAM 610-1. However, errors still remain in the 1$^{st}$ set of ×2 DQs and recalculating $S_{DEC}$ to locate and correct bit errors does not provide a CE solution as the number of bit errors exceeds 2 bits. Also, as similar steps to apply $S_{parity}$ and recalculate $S_{DEC}$ for the remaining 4$^{th}$, 5$^{th}$ and 6$^{th}$ sets of DQs will end in a similar determination of not providing a CE solution. As a result, only one CE solution was found with the 1$^{st}$ set of DQs as shown in FIG. 9A.

FIG. 10 illustrates parity schemes 1000. In some examples, as shown in FIG. 10, parity schemes 1000 includes parity scheme 700 as mentioned above for FIG. 7 and a different parity scheme 1001. Also shown in FIG. 10 are possible error patterns that may occur due to an SWL driver failure that may cause hard bit errors to all bits accessed via DQ0 of ×4 DRAM 610-0 or may cause hard bit errors to two rows of bits accessed via DQ0 to DQ3 of ×4 DRAM 610-1. Although hybrid ECC scheme 600 can detect and correct hard+soft (e.g., random) combined errors, parity scheme 700 is not able to cover the hard error patterns depicted in FIG. 10 that cover two rows of bits accessed via DQ0 to DQ3 of ×4 DRAM 610-1 via 2 bursts. For example, D0 and D16 are involved in generating P0 included in parity 705. Thus, in the error pattern impacting DQ0 to DQ3 of ×4 DRAM 610-1, the syndrome S0 included in parity syndrome 710 becomes zero and no error can be detected because both D0 and D16 are corrupted. However, if the parity bits are determined using parity scheme 1001, only one bit per parity is corrupted regardless of which of the two depicted error patterns exist and corresponding parity syndrome 1025 can detect and correct these types of hard errors when applied.

FIG. 11 illustrates example hybrid ECC scheme 1110 and 1120. Hybrid ECC scheme 600 described above and shown in FIG. 6 and also described in relation to FIGS. 7-10, are related to a narrow, 4-bit memory channel. Hybrid ECC schemes described in this disclosure are not limited to 4-bit memory channels. Hybrid ECC scheme 1110 depicts a use of a DDR4-based memory channel including ×4 DRAMs 110-0 to 110-17. According to the DDR4 standard, a memory channel may consist of a 64-bit data bus and an 8-bit ECC/parity bus accessed over multiple bursts. For example, hybrid ECC scheme includes 16 ×4 DRAM devices (1110-0 to 1110-15) for data and 2 ×4 DRAM devices (1110-16 and 1110-17) for ECC and parity. Also, a burst length of 8 applies to accessing these ×4 DRAM devices shown for hybrid ECC scheme 1110. If DDR4 ×8 DRAM devices are used as shown in FIG. 11 for hybrid ECC scheme, 8 ×8 DRAM devices (1120-0 to 1120-7) are used for data and 1 ×8 DRAM device (1120-8) is for ECC and parity. For either hybrid ECC scheme 1110 or 1120, 4 DQ failures can be covered by 32-bits of parity. Also, random bit errors may be detected and corrected by 32-bits of ECC. However, only 20 bits of ECC are required to enable detection and correction (DEC) for a 512-bit data codeword (21 bits for DEC-TED), triple error correction (TEC) may be implemented or the remaining 11-12 bits may be exploited for other purposes (e.g., as tag bits for a hierarchical or 2 level memory).

FIG. 12 illustrates example hybrid ECC schemes 1210 and 1220. In some examples, hybrid ECC schemes 1210 and 1220 may be implemented for DRAM devices designed to operate in accordance with the DDR5 standard and thus will have a burst length of 16 and thus a 512-bit memory channel can be supported by ½ the number of ×4 DRAMS (1210-0 to 1210-8) or ×8 DRAMS (1220-0 to 1220-4) compared to DDR4 DRAM devices. For hybrid ECC scheme 1210, the same ECC/parity overhead that includes use of 12.5% or ⅛$^{th}$ of DRAM devices as was shown as being used in FIG. 11. However, for hybrid ECC scheme 1220, ECC/parity overhead uses 25% or ¼$^{th}$ of DRAM devices when all bits stored to ×8 DRAM 1220-4 are used for ECC/parity bits.

FIG. 13 illustrates example hybrid ECC schemes 1310 and 1320. According to some examples, hybrid ECC schemes 1310 and 1320 may mitigate at least some of the ECC/parity overhead associated with hybrid ECC schemes 1210 and 1220 mentioned above for FIG. 12. For these examples, separate DDR5 DRAM devices are not used entirely for ECC and Parity. Instead, bits for ECC used in an error correction algorithm (e.g., BCH) may be placed in a DRAM device that also maintains some data bits. For example, data bits may be placed in ×4 DRAM 1310-7 for hybrid ECC scheme 1310 along with ECC bits to correct/protect a data size of 512-bits. Also, data bits may be placed in ×8 DRAM 1320-3 along with ECC bits to also correct/protect a data size of 512-bits. Further, a smaller number of 8×4 DRAM devices (e.g., 1310-0 to 1310-7) for hybrid ECC scheme 1310 may be deployed compared to the 8×4 DRAM devices for hybrid ECC scheme 1310 if the burst length is increased to 18 as shown in FIG. 13. Also, a smaller number of 4×8 DRAM devices (e.g., 1320-0 to 1310-3) for hybrid ECC scheme 1320 may be deployed compared to the 5 ×8 DRAM devices for hybrid ECC scheme 1310 if the burst length is similarly increased to 18.

Figure 14:
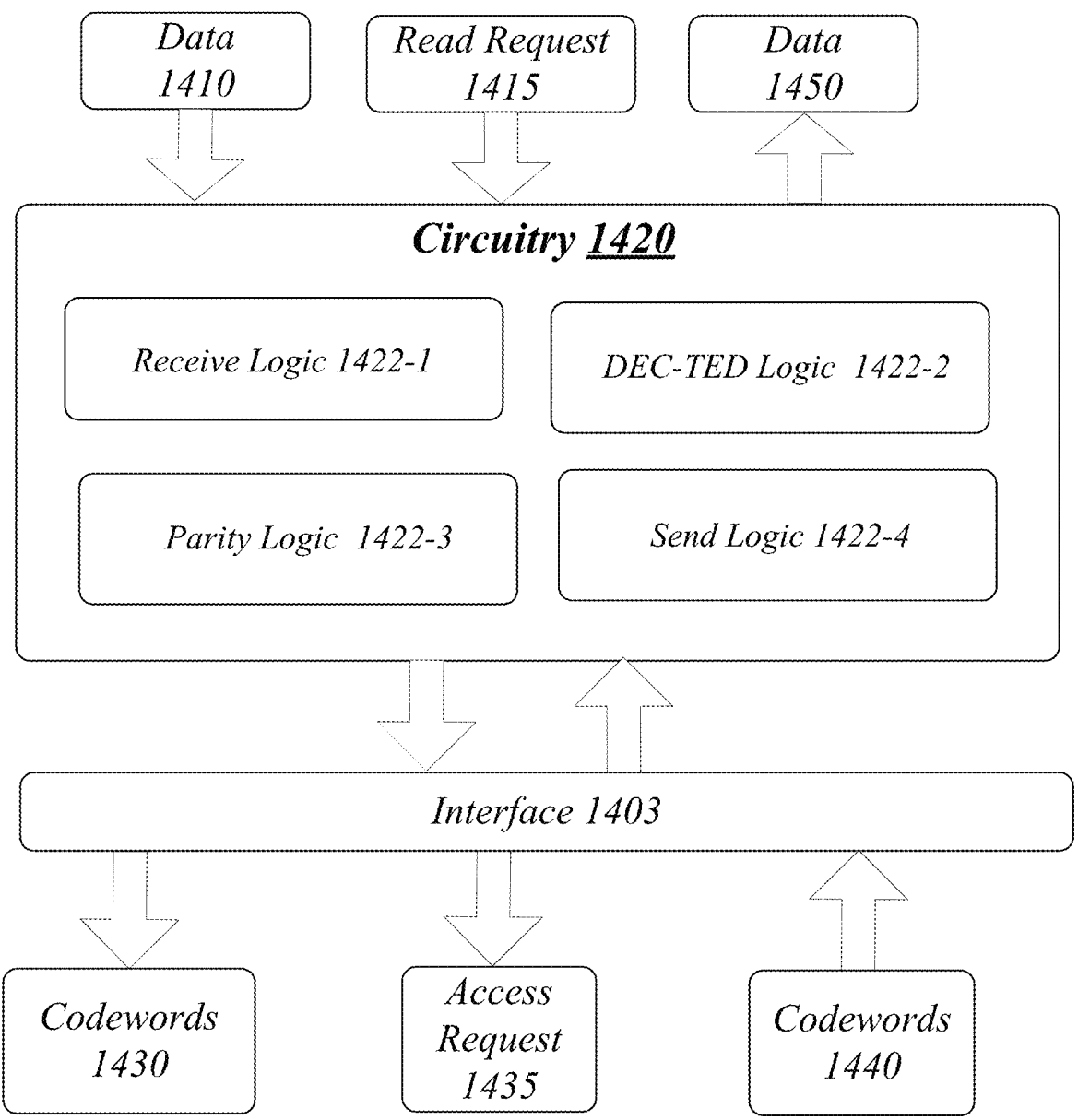
FIG. 14 illustrates an example apparatus.

FIG. 14 illustrates an example apparatus 1400. Although apparatus 1400 shown in FIG. 14 has a limited number of elements in a certain topology, it may be appreciated that the apparatus 1400 may include more or less elements in alternate topologies as desired for a given implementation.

According to some examples, apparatus 1400 may be supported by circuitry 1420 and apparatus 1400 may be a memory controller coupled with a plurality of memory devices of a memory sub-system coupled through an interface 1403 that may also be used to access data included in one or more codewords (e.g., via read or write operations) that is stored in the plurality of memory devices. The memory controller may be coupled with or integrated with one or more processor cores. Circuitry 1420 may be arranged to execute one or more software or firmware implemented logic, components, or modules 1422-*a* (e.g., implemented, at least in part, by a controller of a memory device). It is worthy to note that "a" and "b" and "c" and similar designators as used herein are intended to be variables representing any positive integer. Thus, for example, if an implementation sets a value for a=4, then a complete set of software or firmware for logic, components or modules 1422-*a* may include logic 1422-1, 1422-2, 1422-3 or 1422-4. Also, at least a portion of "logic" may be software/firmware stored in computer-readable media, or may be implemented, at least in part in hardware and although the logic is shown in FIG. 14 as discrete boxes, this does not limit logic to storage in distinct computer-readable media components (e.g., a separate memory, etc.) or implementation by distinct hardware components (e.g., separate ASICs or FPGAs).

According to some examples, circuitry 1420 may include a processor or processor circuitry. The processor or processor circuitry, in some examples, may be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples, circuitry 1420 may also include one or more ASICs or programmable logic (e.g., FPGA) and, in some examples, at least some logic 1422-*a* may be implemented as hardware elements of these ASICs or programmable logic.

According to some examples, apparatus 1400 may include a receive logic 422-1. Receive logic 1422-1 may be a logic and/or feature executed by circuitry 1420 to receive data to store to the plurality of memory devices coupled with apparatus via interface 1403. In some examples, data 1410 may include the data to store to the plurality of memory. Data 1410, for example, may include 8 bytes or 64 bits of data.

In some examples, apparatus 1400 may also include a DEC-TED logic 1422-2. TEC-DEC logic 1422-2 may be a logic and/or feature executed by circuitry 1420 to generate a first codeword that includes a first number of data bits to represent the data and a second number of error correction control (ECC) bits, the data and ECC bits of the first codeword to be stored to the plurality of memory devices, the plurality of memory devices separately having at least 2 sets of DQs via which stored bits are accessed in multiple bursts. In some examples, the second number of ECC bits may be based on double error correction-triple error detection (DEC-TED) capabilities to correct 2 bit errors in the first number of data bits and detect up to 3 bit errors in the first number of data bits using the second number of ECC bits.

According to some examples, apparatus 1400 may also include a parity logic 1422-3. Parity logic 1422-3 may be a logic and/or feature executed by circuitry 1420 to generate a second codeword that includes the data and ECC bits of the first codeword and a third number of parity bits, each parity bit generated based on a bitwise exclusive or (XOR) of 1 bit from each set of 2 DQs via which bits from among the first number of data bits and among the second number of ECC bits are accessed, the parity bits to be stored to a memory device among the plurality of memory devices, the parity bits accessed via at least 1 set of 2 DQs included in the memory device.

In some examples, apparatus 1400 may also include a send logic 1422-4. Send logic 1422-4 may be a logic and/or feature executed by circuitry 1420 to cause the data, ECC and parity bits included in the first and second codewords to be stored to the plurality of memory devices. Codewords 1430 may include the first and second codewords to be stored to the plurality of memory devices.

According to some examples, receive logic 1442-1 may receive the data, ECC and parity bits included in the first and second codewords responsive to an access of the first and second codewords from the plurality of memory devices. For these examples, access request 1435 may cause the plurality of memory devices to send codewords 1440 through interface 1403 responsive to a read request 1415 for the data included in these codewords. Codewords 1440 include the first and second codewords that were stored to the plurality of memory devices as mentioned above. DEC-TED logic 1422-2 may then calculate a first syndrome for the first codeword using the ECC bits and determine whether the first codeword has detected bit errors based on whether the calculated first syndrome equals 0. Parity logic 1422-3 may also calculate a second syndrome for the second codeword using the parity bits and determine whether the second codeword has detected bit errors based on whether the calculated second syndrome equals 0. If both the first and second syndromes are equal to 0, then no bit errors are detected and send logic 1422-4 sends data 1450 to the source of read request 1415.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 15 illustrates an example of a logic flow 1500. Logic flow 1500 may be representative of some or all of the operations executed by one or more logic, features, or devices described herein, such as logic and/or features included in apparatus 1400. More particularly, logic flow 1500 may be implemented by one or more of receive logic 1422-1, DEC-TED logic 1422-2, parity logic 1422-3 or send logic 1422-4.

According to some examples, as shown in FIG. 15, logic flow 1500 at block 1502 may generate a first codeword that includes a first number of data bits and a second number of ECC bits, the data and ECC bits of the first codeword to be stored to a plurality of memory devices, the plurality of memory devices separately having at least 2 sets of DQs via which stored bits are accessed in multiple bursts. For these examples, DEC-TED logic 1422-2 may generate the first codeword.

In some examples, logic flow 1500 at block 1504 may generate a second codeword that includes the data and ECC bits of the first codeword and a third number of parity bits, each parity bit generated based on a bitwise XOR of 1 bit from each set of 2 DQs via which bits from among the first number of data bits and among the second number of ECC bits are accessed, the parity bits to be stored to a memory device among the plurality of memory devices, the parity bits accessed via at least 1 set of 2 DQs included in the memory device. For these examples, parity logic 1422-3 may generate the second codeword.

According to some examples, logic flow 1500 at block 1506 may cause the data, ECC and parity bits included in the first and second codewords to be stored to the plurality of memory devices. For these examples, send logic 1422-4 may cause the first and second codewords to be stored to the plurality of memory devices.

FIG. 16 illustrates an example of a first storage medium. As shown in FIG. 16, the first storage medium includes a storage medium 1600. The storage medium 1600 may comprise an article of manufacture. In some examples, storage medium 1600 may include any non-transitory computer readable medium or machine readable medium, such as an optical, magnetic or semiconductor storage. Storage medium 1600 may store various types of computer executable instructions, such as instructions to implement logic flow 1500. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 17:
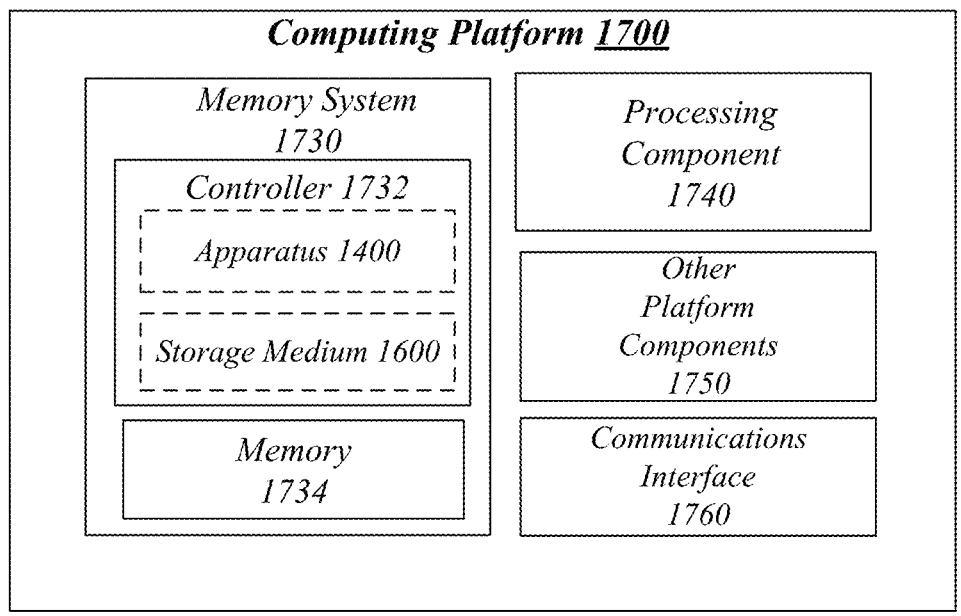
FIG. 17 illustrates an example computing platform.

FIG. 17 illustrates an example computing platform 1700. In some examples, as shown in FIG. 17, computing platform 1700 may include a memory system 1730, a processing component 1740, other platform components 1750 or a communications interface 1760. According to some examples, computing platform 1700 may be implemented in a computing device.

According to some examples, memory system 1730 may include a controller 1732 and a memory 1734. For these examples, circuitry resident at or located at controller 1732 may execute at least some processing operations or logic for apparatus 1400 and may include storage media that includes storage medium 1600. Also, memory 1734 may include similar types of memory that are described above for system 100 shown in FIG. 1. In some examples, controller 1732 may be part of a same die with memory 1734.

According to some examples, processing component 1740 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1750 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1750 or storage system 1730 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1760 may include logic and/or features to support a communication interface. For these examples, communications interface 1760 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (hereinafter "IEEE 802.3").

Computing platform 1700 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1700 described herein, may be included or omitted in various embodiments of computing platform 1700, as suitably desired.

The components and features of computing platform 1700 may be implemented using any combination of discrete circuitry, ASICs, logic gates and/or single chip architectures. Further, the features of computing platform 1700 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The following examples pertain to additional examples of technologies disclosed herein.

Example 1. An example apparatus may include an interface to couple with a plurality of memory devices. The apparatus may also include circuitry to receive data to store to the plurality of memory devices. The circuitry may also generate a first codeword that includes a first number of data bits to represent the data and a second number of ECC bits, the data and ECC bits of the first codeword to be stored to the plurality of memory devices, the plurality of memory devices separately having at least 2 sets of DQs via which stored bits are accessed in multiple bursts. The circuitry may also generate a second codeword that includes the data and ECC bits of the first codeword and a third number of parity bits, each parity bit generated based on a bitwise XOR of 1 bit from each set of 2 DQs via which bits from among the first number of data bits and among the second number of ECC bits are accessed. The parity bits may be stored to a memory device among the plurality of memory devices. The parity bits may be accessed via at least 1 set of 2 DQs included in the memory device. The circuitry may also cause the data, ECC and parity bits included in the first and second codewords to be stored to the plurality of memory devices.

Example 2. The apparatus of example 1, the circuitry may also receive the data, ECC and parity bits included in the first and second codewords responsive to an access of the first and second codewords from the plurality of memory devices. The circuitry may also calculate a first syndrome for the first codeword using the ECC bits. The circuitry may also calculate a second syndrome for the second codeword using the parity bits. The circuitry may also determine whether the first codeword has detected bit errors based on whether the calculated first syndrome equals 0. The circuitry may also determine whether the second codeword has detected bit errors based on whether the calculated second syndrome equals 0.

Example 3. The apparatus of example 2, the first syndrome calculated based on a BCH code algorithm. For this example, the second number of ECC bits used to calculate the first syndrome may be based on DEC-TED capabilities to correct 2 bit errors in the first number of data bits and detect up to 3 bit errors in the first number of data bits using the second number of ECC bits.

Example 4. The apparatus of example 2, the circuitry may also determine that the first and second syndromes are equal to 0. The circuitry may also determine that the first and second codewords include no bit errors.

Example 5. The apparatus of example 2, the circuitry may also determine that the first and second syndromes are not equal to 0. The circuitry may also determine that the second codeword includes errors. The circuitry may also apply a parity syndrome for a first set of 2 DQs from among a plurality of sets of 2 DQs via which bits from the first number of data bits and the second number of ECC bits are accessed in the multiple bursts. The circuitry may also recalculate the first syndrome using the ECC bits based on the applied parity syndrome for the first set of 2 DQs. The circuitry may also determine whether the recalculated first syndrome equals zero.

Example 6. The apparatus of example 5, the circuitry may also determine that the recalculated first syndrome equals zero. The circuitry may also determine that the applied parity syndrome to the first set of 2 DQs has corrected detected bits errors in bits accessed via the first set of 2 DQs.

Example 7. The apparatus of example 5, the circuitry may also determine that the recalculated first syndrome does not equal zero. The circuitry may also compare bit error locations of data bits indicated in the calculated first syndrome to bit error locations of data bits indicated in the recalculated first syndrome. The circuitry may also determine that the bit error locations match. The circuitry may also determine whether a number of bit errors detected is 1 or 2 bit errors, if 2 bit errors then determine whether the 2 bit errors are for 2 bits accessed via separate sets of 2 DQs that are aligned based on access to the plurality of memory devices during a same burst.

Example 8. The apparatus of example 7, the circuitry may also determine that the number of bit errors is 1. The circuitry may also determine that the 1 bit error is correctable.

Example 9. The apparatus of example 7, the circuitry may also determine that the number of bits errors is 2 and the 2 bits errors are for 2 bits accessed via separate sets of 2 DQs that are aligned. The circuitry may also determine that the 2 bit errors are correctable.

Example 10. The apparatus of example 2, the circuitry may also determine that the first syndrome does not equal zero and the second syndrome equals zero. The circuitry may also determine bit error locations of data bits indicated in the calculated first syndrome. The circuitry may also determine whether a number of bit errors detected is 1 or 2 bit errors, if 2 bit errors then determine whether the 2 bit errors are for 2 bits accessed via separate sets of 2 DQs that are aligned based on access to the plurality of memory devices during a same burst.

Example 11. The apparatus of example 10, the circuitry may also determine that the number of bit errors is 1 and determine that the 1 bit error is correctable.

Example 12. The apparatus of example 10, the circuitry may also determine that the number of bits errors is 2 and the 2 bits errors are for 2 bits accessed via separate sets of 2 DQs that are aligned and determine that the 2 bit errors are correctable.

Example 13. The apparatus of example 2, the plurality of memory devices may be DRAM devices.

Example 14. The apparatus of example 13, the DRAM devices may separately include 4 DQ pins to access bits for data, ECC or parity stored in a given DRAM device from among the DRAM devices.

Example 15. The apparatus of example 14, the DRAM devices may include 3 DRAM devices. The first number of data bits is 64, the second number of ECC bits is 16, and the third number of parity bits is 16. For this example, 2 of the 3 DRAM devices may store the 64 data bits and 1 of the 3 DRAM devices may store the 16 ECC bits and the 16 parity bits. Stored bits may be accessed via the 4 DQ pins included in each of the 3 DRAM devices in 8 bursts in order to access all 64 data bits, all 16 ECC bits and all 16 parity bits.

Example 16. The apparatus of example 14, the DRAM devices may include 9 DRAM devices. For this example, the first number of data bits is 512, the second number of ECC bits is 32, and the third number of parity bits is 32. Also, 8 of the 9 DRAM devices may store the 512 data bits and 1 of the 9 DRAM devices to store the 32 ECC bits and the 32 parity bits. Stored bits may be accessed via the 4 DQ pins included in each of the 9 DRAM devices in 16 bursts to access all 512 data bits, all 32 ECC bits and all 32 parity bits.

Example 17. An example method may include generating, at circuitry of a controller for a plurality of memory devices, a first codeword that includes a first number of data bits and a second number of ECC bits, the data and ECC bits of the first codeword to be stored to the plurality of memory devices, the plurality of memory devices separately having at least 2 sets of DQs via which stored bits are accessed in multiple bursts. The method may also include generating a second codeword that includes the data and ECC bits of the first codeword and a third number of parity bits. Each parity bit may be generated based on a bitwise XOR of 1 bit from each set of 2 DQs via which bits from among the first number of data bits and among the second number of ECC bits are accessed. The parity bits may be stored to a memory device among the plurality of memory devices, the parity bits accessed via at least 1 set of 2 DQs included in the memory device. The method may also include causing the data, ECC and parity bits included in the first and second codewords to be stored to the plurality of memory devices.

Example 18. The method of example 17 may also include receiving the data, ECC and parity bits included in the first and second codewords following an access of the first and second codewords from the plurality of memory devices. The method may also include calculating a first syndrome for the first codeword using the ECC bits. The method may also include calculating a second syndrome for the second codeword using the parity bits. The method may also include determining whether the first codeword has detected bit errors based on whether the calculated first syndrome equals 0. The method may also include determining whether the second codeword has detected bit errors based on whether the calculated second syndrome equals 0.

Example 19. The method of example 18, the first syndrome may be calculated based on a BCH code algorithm. For this example, the second number of ECC bits used to calculate the first syndrome are based on DEC-TED capabilities to correct 2 bit errors in the first number of data bits and detect up to 3 bit errors in the first number of data bits using the second number of ECC bits.

Example 20. The method of example 18 may also include determining that the first and second syndromes are equal to 0. The method may also include determining that the first and second codewords include no bit errors.

Example 21. The method of example 18 may also include determining that the first and second syndromes are not equal to 0. The method may also include determining that the second codeword includes errors. The method may also include applying a parity syndrome for a first set of 2 DQs from among a plurality of sets of 2 DQs via which bits from the first number of data bits and the second number of ECC bits are accessed in the multiple bursts. The method may also include recalculating the first syndrome using the ECC bits based on the applied parity syndrome for the first set of 2 DQs. The method may also include determining whether the recalculated first syndrome equals zero.

Example 22. The method of example 21 may also include determining that the recalculated first syndrome equals zero. The method may also include determining that the applied parity syndrome to the first set of 2 DQs has corrected detected bits errors in bits accessed via the first set of 2 DQs.

Example 23. The method of example 21 may also include determining that the recalculated first syndrome does not equal zero. The method may also include comparing bit error locations of data bits indicated in the calculated first syndrome to bit error locations of data bits indicated in the recalculated first syndrome. The method may also include determining that the bit error locations match. The method may also include determining whether a number of bit errors detected is 1 or 2 bit errors. For this example, if 2 bit errors then determining whether the 2 bit errors are for 2 bits accessed via separate sets of 2 DQs that are aligned based on access to the plurality of memory devices during a same burst.

Example 24. The method of example 23 may also include determining that the number of bit errors is 1. The method may also include determining that the 1 bit error is correctable.

Example 25. The method of example 23 may also include determining that the number of bits errors is 2 and the 2 bits errors are for 2 bits accessed via separate sets of 2 DQs that are aligned. The method may also include determining that the 2 bit errors are correctable.

Example 26. The method of example 18, the first syndrome does not equal zero and the second syndrome equals zero. For this example, the method may also include determining bit error locations of data bits indicated in the calculated first syndrome. The method may also include determining whether a number of bit errors detected is 1 or 2 bit errors. If 2 bit errors then the method may also include determining whether the 2 bit errors are for 2 bits accessed via separate sets of 2 DQs that are aligned based on access to the plurality of memory devices during a same burst.

Example 27. The method of example 26 may also include determining that the number of bit errors is 1 and determining that the 1 bit error is correctable.

Example 28. The method of example 26 may also include determining that the number of bits errors is 2 and the 2 bits errors are for 2 bits accessed via separate sets of 2 DQs that are aligned and determining that the 2 bit errors are correctable.

Example 29. The method of example 18, the plurality of memory devices may be dynamic random access memory (DRAM) devices.

Example 30. The method of example 29, the DRAM devices may separately include 4 DQ pins to access bits for data, ECC or parity stored in a given DRAM device from among the DRAM devices.

Example 31. The method of example 30, the DRAM devices may include 3 DRAM devices. For this example, the first number of data bits is 64, the second number of ECC bits is 16, and the third number of parity bits is 16. Also, 2 of the 3 DRAM devices may store the 64 data bits and 1 of the 3 DRAM devices may store the 16 ECC bits and the 16 parity bits. Stored bits may be accessed via the 4 DQ pins included in each of the 3 DRAM devices in 8 bursts in order to access all 64 data bits, all 16 ECC bits and all 16 parity bits.

Example 32. The method of example 30, the DRAM devices may include 9 DRAM devices. For this example, the first number of data bits is 512, the second number of ECC bits is 32, and the third number of parity bits is 32. Also, 8 of the 9 DRAM devices may store the 512 data bits and 1 of the 9 DRAM devices may store the 32 ECC bits and the 32 parity bits. The stored bits may be accessed via the 4 DQ pins included in each of the 9 DRAM devices in 16 bursts to access all 512 data bits, all 32 ECC bits and all 32 parity bits.

Example 33. An example at least one machine readable medium may include a plurality of instructions that in response to being executed by a system may cause the system to carry out a method according to any one of examples 18 to 32.

Example 34. An example apparatus may include means for performing the methods of any one of examples 18 to 32.

Example 35. An example system may include a plurality of memory devices and a memory controller to include circuitry. The circuitry may receive data to store to the plurality of memory devices. The circuitry may also generate a first codeword that includes a first number of data bits to represent the data and a second number of ECC bits, the data and ECC bits of the first codeword to be stored to the plurality of memory devices. The plurality of memory devices may separately have at least 2 sets of DQs via which stored bits are accessed in multiple bursts. The circuitry may also generate a second codeword that includes the data and ECC bits of the first codeword and a third number of parity bits. Each parity bit may be generated based on a bitwise XOR of 1 bit from each set of 2 DQs via which bits from among the first number of data bits and among the second number of ECC bits are accessed. The parity bits may be stored to a memory device among the plurality of memory devices. The parity bits may be accessed via at least 1 set of 2 DQs included in the memory device. The circuitry may also cause the data, ECC and parity bits included in the first and second codewords to be stored to the plurality of memory devices.

Example 36. The system of example 35, the circuitry may also receive the data, ECC and parity bits included in the first and second codewords responsive to an access of the first and second codewords from the plurality of memory devices. The circuitry may also calculate a first syndrome for the first codeword using the ECC bits. The circuitry may also calculate a second syndrome for the second codeword using the parity bits. The circuitry may also determine whether the first codeword has detected bit errors based on whether the calculated first syndrome equals 0. The circuitry may also determine whether the second codeword has detected bit errors based on whether the calculated second syndrome equals 0.

Example 37. The system of example 36, the first syndrome may be calculated based on a BCH code algorithm. For this example, the second number of ECC bits used to calculate the first syndrome may be based on DEC-TED capabilities to correct 2 bit errors in the first number of data bits and detect up to 3 bit errors in the first number of data bits using the second number of ECC bits.

Example 38. The system of example 36, the circuitry may also determine that the first and second syndromes are equal to 0 and determine that the first and second codewords include no bit errors.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    an interface to couple with a plurality of memory devices; and
    circuitry to:
        receive data to store to the plurality of memory devices;
        generate a first codeword that includes a first number of data bits to represent the data and a second number of error correction control (ECC) bits, the data and ECC bits of the first codeword to be stored to the plurality of memory devices, the plurality of memory devices separately having at least 2 sets of data pins (DQs) via which stored bits are accessed in multiple bursts;
        generate a second codeword that includes the data and ECC bits of the first codeword and a third number of parity bits, each parity bit generated based on a bitwise exclusive or (XOR) of 1 bit from each set of 2 DQs via which bits from among the first number of data bits and among the second number of ECC bits are accessed, the parity bits to be stored to a memory device among the plurality of memory devices, the parity bits accessed via at least 1 set of 2 DQs included in the memory device; and
        cause the data, ECC and parity bits included in the first and second codewords to be stored to the plurality of memory devices.

2. The apparatus of claim 1, further comprising the circuitry to:
    receive the data, ECC and parity bits included in the first and second codewords responsive to an access of the first and second codewords from the plurality of memory devices;
    calculate a first syndrome for the first codeword using the ECC bits;
    calculate a second syndrome for the second codeword using the parity bits;
    determine whether the first codeword has detected bit errors based on whether the calculated first syndrome equals 0; and
    determine whether the second codeword has detected bit errors based on whether the calculated second syndrome equals 0.

3. The apparatus of claim 2, comprising the first syndrome calculated based on a Bose-Chaundhuri-Hocquegnhem (BCH) code algorithm, wherein the second number of ECC bits used to calculate the first syndrome are based on double error correction—triple error detection (DEC-TED) capabilities to correct 2 bit errors in the first number of data bits and detect up to 3 bit errors in the first number of data bits using the second number of ECC bits.

4. The apparatus of claim 2, comprising the circuitry to:
    determine that the first and second syndromes are equal to 0: and
    determine that the first and second codewords include no bit errors.

5. The apparatus of claim 2, comprising the circuitry to:
    determine that the first and second syndromes are not equal to 0;
    determine that the second codeword includes errors;
    apply a parity syndrome for a first set of 2 DQs from among a plurality of sets of 2 DQs via which bits from the first number of data bits and the second number of ECC bits are accessed in the multiple bursts;
    recalculate the first syndrome using the ECC bits based on the applied parity syndrome for the first set of 2 DQs; and
    determine whether the recalculated first syndrome equals zero.

6. The apparatus of claim 5, comprising the circuitry to:
    determine that the recalculated first syndrome equals zero; and
    determine that the applied parity syndrome to the first set of 2 DQs has corrected detected bits errors in bits accessed via the first set of 2 DQs.

7. The apparatus of claim 5, comprising the circuitry to:
    determine that the recalculated first syndrome does not equal zero;
    compare bit error locations of data bits indicated in the calculated first syndrome to bit error locations of data bits indicated in the recalculated first syndrome;
    determine that the bit error locations match; and
    determine whether a number of bit errors detected is 1 or 2 bit errors, if 2 bit errors then determine whether the 2 bit errors are for 2 bits accessed via separate sets of 2 DQs that are aligned based on access to the plurality of memory devices during a same burst.

8. The apparatus of claim 7, comprising the circuitry to:
    determine that the number of bit errors is 1; and
    determine that the 1 bit error is correctable.

9. The apparatus of claim 7, comprising the circuitry to:
    determine that the number of bits errors is 2 and the 2 bits errors are for 2 bits accessed via separate sets of 2 DQs that are aligned; and
    determine that the 2 bit errors are correctable.

10. The apparatus of claim 2, comprising the circuitry to:
determine that the first syndrome does not equal zero and the second syndrome equals zero;
determine bit error locations of data bits indicated in the calculated first syndrome; and
determine whether a number of bit errors detected is 1 or 2 bit errors, if 2 bit errors then determine whether the 2 bit errors are for 2 bits accessed via separate sets of 2 DQs that are aligned based on access to the plurality of memory devices during a same burst.

11. The apparatus of claim 10, comprising the circuitry to:
determine that the number of bit errors is 1; and
determine that the 1 bit error is correctable.

12. The apparatus of claim 10, comprising the circuitry to:
determine that the number of bits errors is 2 and the 2 bits errors are for 2 bits accessed via separate sets of 2 DQs that are aligned; and
determine that the 2 bit errors are correctable.

13. The apparatus of claim 2, the plurality of memory devices comprising dynamic random access memory (DRAM) devices.

14. The apparatus of claim 13, comprising the DRAM devices separately include 4 DQ pins to access bits for data, ECC or parity stored in a given DRAM device from among the DRAM devices.

15. The apparatus of claim 14, the DRAM devices comprising 3 DRAM devices, the first number of data bits is 64, the second number of ECC bits is 16, and the third number of parity bits is 16, 2 of the 3 DRAM devices to store the 64 data bits and 1 of the 3 DRAM devices to store the 16 ECC bits and the 16 parity bits, wherein stored bits are accessed via the 4 DQ pins included in each of the 3 DRAM devices in 8 bursts in order to access all 64 data bits, all 16 ECC bits and all 16 parity bits.

16. The apparatus of claim 14, the DRAM devices comprising 9 DRAM devices, the first number of data bits is 512, the second number of ECC bits is 32, and the third number of parity bits is 32, 8 of the 9 DRAM devices to store the 512 data bits and 1 of the 9 DRAM devices to store the 32 ECC bits and the 32 parity bits, wherein stored bits are accessed via the 4 DQ pins included in each of the 9 DRAM devices in 16 bursts to access all 512 data bits, all 32 ECC bits and all 32 parity bits.

17. A method comprising:
generating, at circuitry of a controller for a plurality of memory devices, a first codeword that includes a first number of data bits and a second number of error correction control (ECC) bits, the data and ECC bits of the first codeword to be stored to the plurality of memory devices, the plurality of memory devices separately having at least 2 sets of data pins (DQs) via which stored bits are accessed in multiple bursts;
generating a second codeword that includes the data and ECC bits of the first codeword and a third number of parity bits, each parity bit generated based on a bitwise exclusive or (XOR) of 1 bit from each set of 2 DQs via which bits from among the first number of data bits and among the second number of ECC bits are accessed, the parity bits to be stored to a memory device among the plurality of memory devices, the parity bits accessed via at least 1 set of 2 DQs included in the memory device; and
causing the data, ECC and parity bits included in the first and second codewords to be stored to the plurality of memory devices.

18. The method of claim 17, further comprising:
receiving the data, ECC and parity bits included in the first and second codewords following an access of the first and second codewords from the plurality of memory devices;
calculating a first syndrome for the first codeword using the ECC bits;
calculating a second syndrome for the second codeword using the parity bits;
determining whether the first codeword has detected bit errors based on whether the calculated first syndrome equals 0; and
determining whether the second codeword has detected bit errors based on whether the calculated second syndrome equals 0.

19. The method of claim 18, comprising the first syndrome calculated based on a Bose-Chaundhuri-Hocquegnhem (BCH) code algorithm, wherein the second number of ECC bits used to calculate the first syndrome are based on double error correction—triple error detection (DEC-TED) capabilities to correct 2 bit errors in the first number of data bits and detect up to 3 bit errors in the first number of data bits using the second number of ECC bits.

20. The method of claim 18, comprising:
determining that the first and second syndromes are equal to 0: and
determining that the first and second codewords include no bit errors.

21. The method of claim 18, comprising:
determining that the first and second syndromes are not equal to 0;
determining that the second codeword includes errors;
applying a parity syndrome for a first set of 2 DQs from among a plurality of sets of 2 DQs via which bits from the first number of data bits and the second number of ECC bits are accessed in the multiple bursts;
recalculating the first syndrome using the ECC bits based on the applied parity syndrome for the first set of 2 DQs; and
determining whether the recalculated first syndrome equals zero.

22. The method of claim 21, comprising:
determining that the recalculated first syndrome equals zero; and
determining that the applied parity syndrome to the first set of 2 DQs has corrected detected bits errors in bits accessed via the first set of 2 DQs.

23. The method of claim 21, comprising:
determining that the recalculated first syndrome does not equal zero;
comparing bit error locations of data bits indicated in the calculated first syndrome to bit error locations of data bits indicated in the recalculated first syndrome;
determining that the bit error locations match; and
determining whether a number of bit errors detected is 1 or 2 bit errors, if 2 bit errors then determining whether the 2 bit errors are for 2 bits accessed via separate sets of 2 DQs that are aligned based on access to the plurality of memory devices during a same burst.

24. A system comprising:
a plurality of memory devices; and
a memory controller to include circuitry to:
receive data to store to the plurality of memory devices;
generate a first codeword that includes a first number of data bits to represent the data and a second number of error correction control (ECC) bits, the data and ECC bits of the first codeword to be stored to the plurality of memory devices, the plurality of memory devices separately having at least 2 sets of data pins (DQs) via which stored bits are accessed in multiple bursts;

generate a second codeword that includes the data and ECC bits of the first codeword and a third number of parity bits, each parity bit generated based on a bitwise exclusive or (XOR) of 1 bit from each set of 2 DQs via which bits from among the first number of data bits and among the second number of ECC bits are accessed, the parity bits to be stored to a memory device among the plurality of memory devices, the parity bits accessed via at least 1 set of 2 DQs included in the memory device; and cause the data, ECC and parity bits included in the first and second codewords to be stored to the plurality of memory devices.

25. The system of claim 24, further comprising the circuitry to:

receive the data, ECC and parity bits included in the first and second codewords responsive to an access of the first and second codewords from the plurality of memory devices;

calculate a first syndrome for the first codeword using the ECC bits;

calculate a second syndrome for the second codeword using the parity bits;

determine whether the first codeword has detected bit errors based on whether the calculated first syndrome equals 0; and determine whether the second codeword has detected bit errors based on whether the calculated second syndrome equals 0.

26. The system of claim 25, comprising the first syndrome calculated based on a Bose-Chaundhuri-Hocquegnhem (BCH) code algorithm, wherein the second number of ECC bits used to calculate the first syndrome are based on double error correction-triple error detection (DEC-TED) capabilities to correct 2 bit errors in the first number of data bits and detect up to 3 bit errors in the first number of data bits using the second number of ECC bits.

27. The system of claim 25, comprising the circuitry to:

determine that the first and second syndromes are equal to 0: and determine that the first and second codewords include no bit errors.

* * * * *